(12) United States Patent
Curtis

(10) Patent No.: US 9,645,184 B2
(45) Date of Patent: May 9, 2017

(54) WATCHDOG CIRCUIT FOR GROUND MONITOR CURRENT SENSING

(71) Applicant: Intermountain Electronics, Inc., Price, UT (US)

(72) Inventor: Dale Curtis, Castle Dale, UT (US)

(73) Assignee: INTERMOUNTAIN ELECTRONICS, INC., Price, UT (US)

( * ) Notice: Subject to any disclaimer, the term of this patent is extended or adjusted under 35 U.S.C. 154(b) by 344 days.

(21) Appl. No.: 14/473,589

(22) Filed: Aug. 29, 2014

(65) Prior Publication Data
US 2015/0061690 A1    Mar. 5, 2015

Related U.S. Application Data

(60) Provisional application No. 61/871,448, filed on Aug. 29, 2013.

(51) Int. Cl.
*G01R 31/02*    (2006.01)
*H02H 3/17*    (2006.01)

(52) U.S. Cl.
CPC .............. *G01R 31/025* (2013.01); *H02H 3/17* (2013.01)

(58) Field of Classification Search
CPC .............................. G01R 31/02; G01R 31/319
USPC .................................................. 324/509, 537
See application file for complete search history.

(56) References Cited

U.S. PATENT DOCUMENTS

| | | | |
|---|---|---|---|
| 3,335,324 A | 8/1967 | Buckeridge | |
| 3,995,200 A | 11/1976 | Stolarczyk | |
| 4,228,475 A | 10/1980 | Sherwood | |
| 4,295,175 A | 10/1981 | Cordray | |
| 4,415,850 A | 11/1983 | Sherwood | |
| 4,437,133 A * | 3/1984 | Rueckert | H02M 7/521 361/100 |
| 4,609,865 A | 9/1986 | Goodman | |
| 4,638,244 A | 1/1987 | Howell | |
| 4,991,105 A | 2/1991 | Pimental | |
| 5,177,657 A | 1/1993 | Baer | |
| 5,576,920 A | 11/1996 | Kosuga et al. | |
| 5,644,461 A | 7/1997 | Miller et al. | |
| 8,149,552 B1 | 4/2012 | Cordill | |

(Continued)

OTHER PUBLICATIONS

U.S. Appl. No. 13/906,807, filed May 31, 2013, Notice of Allowance mailed Aug. 17, 2015.

(Continued)

*Primary Examiner* — Jermele M Hollington
*Assistant Examiner* — Zannatul Ferdous
(74) *Attorney, Agent, or Firm* — Kunzler Law Group

(57) ABSTRACT

A watchdog apparatus for monitoring ground current is disclosed. A system and method also perform the functions of the apparatus. The watchdog apparatus includes a watchdog signal module that generates a watchdog signal. The watchdog signal is generated at a specific interval and includes an identifiable characteristic. The watchdog signal module is part of a device being monitored for functionality. The apparatus, in some embodiments, includes a signal monitoring module that determines if the watchdog signal includes the identifiable characteristic, and an alert module that sends and alert signal in response to the signal monitoring module determining that the watchdog signal does not include the identifiable characteristic.

16 Claims, 11 Drawing Sheets

(56) References Cited

U.S. PATENT DOCUMENTS

| | | | |
|---|---|---|---|
| 8,841,917 B2 | 9/2014 | Wei | |
| 9,197,055 B2 | 11/2015 | Curtis et al. | |
| 2003/0155928 A1 | 8/2003 | Roden | |
| 2004/0049705 A1* | 3/2004 | Liebenow | G06F 1/3218 713/320 |
| 2007/0153436 A1* | 7/2007 | Pellon | G01R 31/1272 361/42 |
| 2007/0159750 A1 | 7/2007 | Peker et al. | |
| 2009/0174981 A1* | 7/2009 | Mallon | G08B 3/10 361/114 |
| 2014/0009166 A1* | 1/2014 | Kaltenegger | G06F 11/0706 324/537 |

OTHER PUBLICATIONS

U.S. Appl. No. 14/473,568, filed Aug. 29, 2014, Office Action mailed Jun. 14, 2016.
U.S. Appl. No. 14/823,959, filed Aug. 11, 2015, Office Action mailed Jun. 16, 2016.
U.S. Appl. No. 14/824,006, filed Aug. 11, 2015, Office Action mailed Jun. 16, 2016.
U.S. Appl. No. 14/824,038, filed Aug. 11, 2015, Office Action mailed Jun. 15, 2016.
U.S. Appl. No. 13/906,807, filed May 31, 2015, Office Action mailed Apr. 9, 2015.
U.S. Appl. No. 13/907,019, filed May 31, 2013, Notice of Allowance mailed Jun. 22, 2015.
U.S. Appl. No. 13/907,057, filed May 31, 2013, Notice of Allowance mailed Jun. 5, 2015.
U.S. Appl. No. 13/907,019 Office Action, mailed Jan. 2, 2015.
U.S. Appl. No. 13/907,057 Office Action, mailed Feb. 6, 2015.
Line Power, Groundkeeper 145 Continuity Type Ground Monitor, http://linepower.com/literature/pdf/LPMS-GK145, 1993.
Service Machine, SMC C54-004 and C54-005 Series Ground Monitors, Publication Date: Feb. 2, 1993.
U.S. Appl. No. 14/823,959, filed Aug, 11, 2015, Notice of Allowance mailed Nov. 4, 2016.
U.S. Appl. No. 14/824,006, filed Aug. 11, 2015, Notice of Allowance mailed Oct. 28, 2016.
U.S. Appl. No. 14/473,568, filed Aug. 29, 2014, Notice of Allowance mailed Nov. 4, 2016.
U.S. Appl. No. 14/824,038, filed Aug. 11, 2015, Notice of Allowance mailed Oct. 28, 2016.

* cited by examiner

WATCHDOG CIRCUIT FOR GROUND MONITOR CURRENT SENSING

CROSS-REFERENCES TO RELATED APPLICATIONS

This application claims the benefit of U.S. Provisional Patent Application No. 61/871,448 entitled "MULTI-FREQUENCY GROUND MONITOR CURRENT SENSING" and filed on Aug. 29, 2013 for Dale Curtis, which is incorporated herein by reference.

FIELD

This invention relates to a watchdog circuit and more particularly relates to using a watchdog circuit for ground monitor current sensing.

BACKGROUND

In certain applications, it is critical to know when a device is not operating properly. For example, in circuits that monitor safety conditions, a malfunctioning device may cause injury or death. Receiving an alert signal of a malfunctioning device may allow time for maintenance personnel to correct the problem. The alert signal may also be used to shut down a device or place the device in a safe state.

SUMMARY

A watchdog apparatus for monitoring ground current is disclosed. A system and method also perform the functions of the apparatus. The watchdog apparatus includes a watchdog signal module that generates a watchdog signal. The watchdog signal is generated at a specific interval and includes an identifiable characteristic. The watchdog signal module is part of a device being monitored for functionality. The apparatus, in some embodiments, includes a signal monitoring module that determines if the watchdog signal includes the identifiable characteristic, and an alert module that sends and alert signal in response to the signal monitoring module determining that the watchdog signal does not include the identifiable characteristic.

In one embodiment, the watchdog signal module includes a first pulse module, a first pulse average module, and a first pulse window module. The first pulse module generates a first pulse signal of a first frequency, and the first pulse signal includes a pulse of a first pulse width. The watchdog signal includes the first pulse signal. The first pulse average module determines a first pulse average. The first pulse average includes an average level of one or more periods of the first pulse signal and the first pulse window module determines if the first pulse average is between a first pulse maximum threshold and a first pulse minimum threshold. The alert module sends an alert signal in response to the first pulse window module determining that the first pulse average is not between the first pulse maximum threshold and the first pulse minimum threshold.

In another embodiment, the watchdog apparatus includes a second pulse module, a second pulse average module, and a second pulse window module. The second pulse module generates a second pulse signal of a second frequency, where the second pulse signal includes a pulse of a second pulse width. The second pulse average module determines a second pulse average. The second pulse average includes an average level of one or more periods of the second pulse signal. The second pulse window module determines if the second pulse average is between a second pulse maximum threshold and a second pulse minimum threshold. In the embodiment, the alert module sends the alert signal in response the first pulse window module determining that the first pulse average is not between the first pulse maximum threshold and the first pulse minimum threshold and/or the second pulse window module determining that the second pulse average is not between the second pulse maximum threshold and the second pulse minimum threshold.

In one embodiment, the first frequency and the second frequency are substantially the same frequency. In another embodiment, the first pulse width differs from the second pulse width. In a further embodiment, the second pulse signal is inverted from the first pulse signal. In another embodiment, the first pulse module generates the first pulse signal independent from the second pulse module generating the second pulse signal.

In one embodiment, the alert signal opens a contact, where opening the contact disconnects power to a load. In a further embodiment, the watchdog apparatus includes a trip module that generates a trip signal, where the trip module generates the trip signal in response to a fault condition in a power source providing the power to the load, and the trip signal includes an active high signal and an active low signal. The active high signal transitions from low to high when the trip module generates the trip signal and the active low signal transitions from high to low when the trip module generates the trip signal. The alert module sends the alert signal in response to the active high signal transitioning high and/or the active low signal transitioning low. In another embodiment, the watchdog apparatus includes a trip error module that sends a trip error signal in response to determining that the active high signal and the active low signal are both simultaneously high or both simultaneously low for a predetermined amount of time.

In one embodiment, the watchdog apparatus includes a power supply failure module that determines failure of one or more power supplies providing power to the watchdog apparatus, where the alert module sends the alert signal in response to the power supply failure module determining that at least one power supply has failed. In another embodiment, the watchdog apparatus monitors functionality of an apparatus to monitor ground current in a grounding conductor of a set of power cables connecting a power source to a load. In a further embodiment, the apparatus to monitor ground current with the watchdog apparatus complies with Mine Safety and Health Administration ("MSHA") testing standard 30 the Code of Federal Regulations ("C.F.R.") section 75, 30 C.F.R. section 77, American Society for Testing and Materials ("ASTP") standard 2135, and MSHA document number ACRI 2003.

In another embodiment, the apparatus to monitor ground current includes a microprocessor that includes at least the watchdog signal module where the watchdog signal module generates the watchdog signal on a pin of the microprocessor. In another embodiment, the device being monitored includes a microprocessor and the microprocessor includes at least the watchdog signal module and the watchdog signal module generates the watchdog signal on a pin of the microprocessor and the signal monitoring module and the alert module are external to the microprocessor.

In one embodiment, the identifiable characteristic includes at least one frequency and the signal monitoring module determines if the watchdog signal includes the at least one frequency. In another embodiment, the identifiable characteristic includes a digital pattern and the signal monitoring module determines if the watchdog signal includes the digital pattern.

A system with a watchdog circuit includes one or more contacts that disconnect a load in an open position and a ground monitor apparatus with a watchdog apparatus. The watchdog apparatus includes a watchdog signal module that generates a watchdog signal. The watchdog signal is generated at a specific interval and includes an identifiable characteristic. The watchdog signal module is part of a device being monitored for functionality. The watchdog apparatus includes a signal monitoring module that determines if the watchdog signal includes the identifiable characteristic and an alert module that sends and alert signal in response to the signal monitoring module determining that the watchdog signal does not include the identifiable characteristic. The alert signal opens the one or more contacts.

A method for a watchdog signal is disclosed. The method includes generating a watchdog signal. The watchdog signal is generated at a specific interval and includes an identifiable characteristic. Generating the watchdog signal is part of monitoring a device for functionality. The method includes determining if the watchdog signal includes the identifiable characteristic, and sending an alert signal in response to the signal monitoring module determining that the watchdog signal does not include the identifiable characteristic.

In one embodiment, the method includes generating a first pulse signal of a first frequency, where the first pulse signal includes a pulse of a first pulse width. The watchdog signal includes the first pulse signal. The method, in the embodiment, includes determining a first pulse average, where the first pulse average includes an average level of one or more periods of the first pulse signal, and determining if the first pulse average is between a first pulse maximum threshold and a first pulse minimum threshold. In the embodiment, the method includes generating a second pulse signal of a second frequency, where the second pulse signal includes a pulse of a second pulse width, determining a second pulse average, where the second pulse average includes an average level of one or more periods of the second pulse signal, and determining if the second pulse average is between a second pulse maximum threshold and a second pulse minimum threshold. In the embodiment, the method also includes sending an alert signal in response to determining that the first pulse average is not between the first pulse maximum threshold and the first pulse minimum threshold and/or determining that the second pulse average is not between the second pulse maximum threshold and the second pulse minimum threshold.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
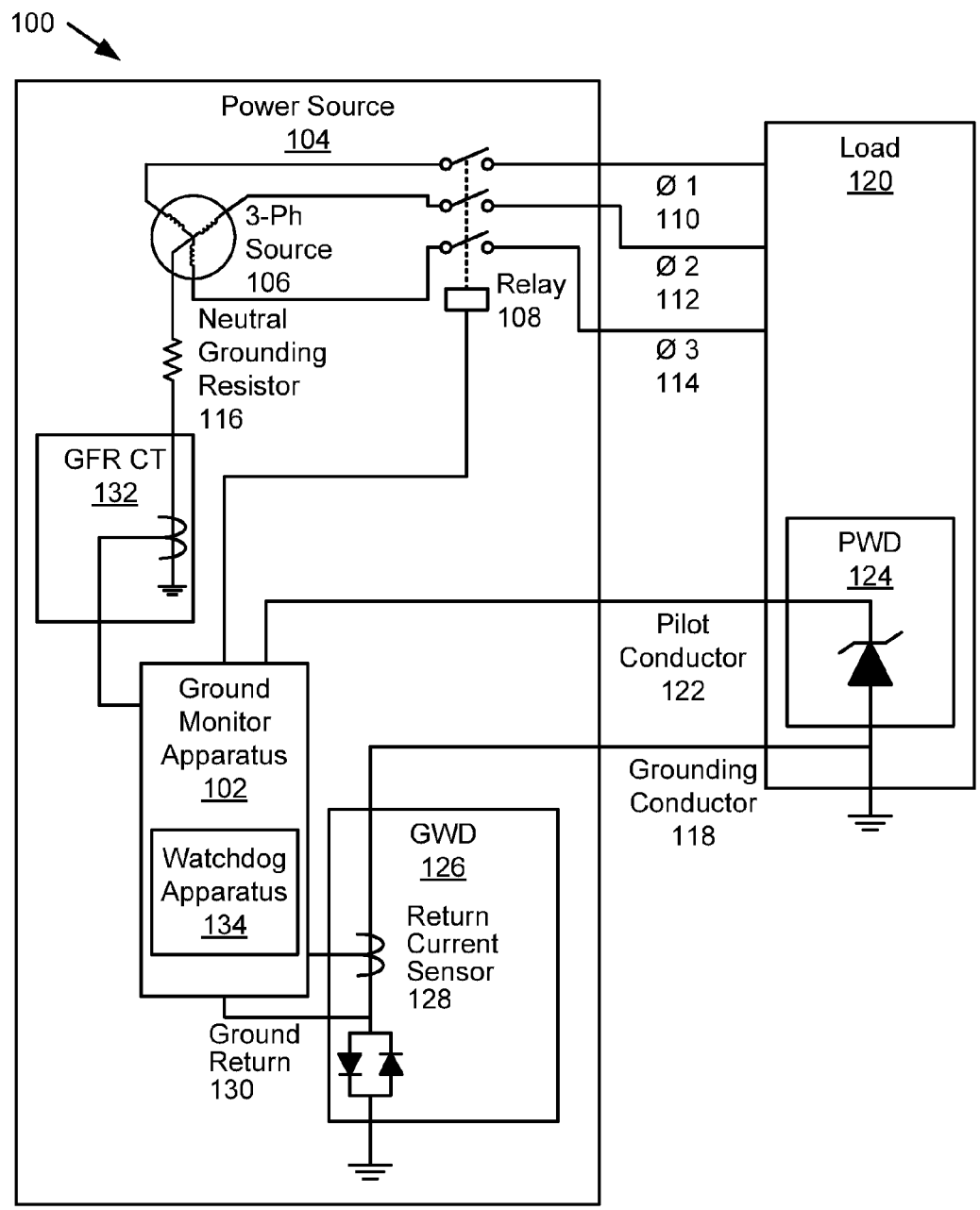
FIG. 1 is a schematic block diagram illustrating one embodiment of a system for ground monitor current sensing in accordance with an embodiment of the present invention.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code. The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wire-line, optical fiber, Radio Frequency (RF), or the like, or any suitable combination of the foregoing In one embodiment, the computer readable medium may comprise a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object oriented programming language such as Java, Smalltalk, C++, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer program product may be shared, simultaneously serving multiple customers in a flexible, automated fashion. The computer program product may be standardized, requiring little customization and scalable, providing capacity on demand in a pay-as-you-go model. The computer program product may be stored on a shared file system accessible from one or more servers.

The computer program product may be integrated into a client, server and network environment by providing for the computer program product to coexist with applications, operating systems and network operating systems software and then installing the computer program product on the clients and servers in the environment where the computer program product will function.

In one embodiment software is identified on the clients and servers including the network operating system where the computer program product will be deployed that are required by the computer program product or that work in conjunction with the computer program product. This includes the network operating system that is software that enhances a basic operating system by adding networking features.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

FIG. 1 is a schematic block diagram illustrating one embodiment of a system 100 for ground monitor current sensing in accordance with an embodiment of the present invention. The system 100 includes a ground monitor apparatus 102, a power source 104, a three-phase power source 106, a relay 108, a first phase 110, a second phase 112, a third phase 114, a neutral grounding resistor 116, a grounding conductor 118, a load 120 with a pilot wire diode ("PWD") 124, a ground wire device ("GWD") 126 with a return current sensor 128, a ground return 130, a ground fault relay ("GFR") current transformer ("CT") 132, and a watchdog apparatus 134, which are described below. The system 100 may be similar to the system 100 of U.S. patent application Ser. No. 13/906,807 entitled "GROUND MONITOR CURRENT SENSING" and filed on May 31, 2013 for Dale Curtis, et al., [hereinafter "the '807 patent application"] which is incorporated herein by reference. The '807 patent application includes a ground monitor apparatus 102 that is different than the ground monitor apparatus 102 described herein, but has similar functionality in monitoring ground current.

Figure 2:
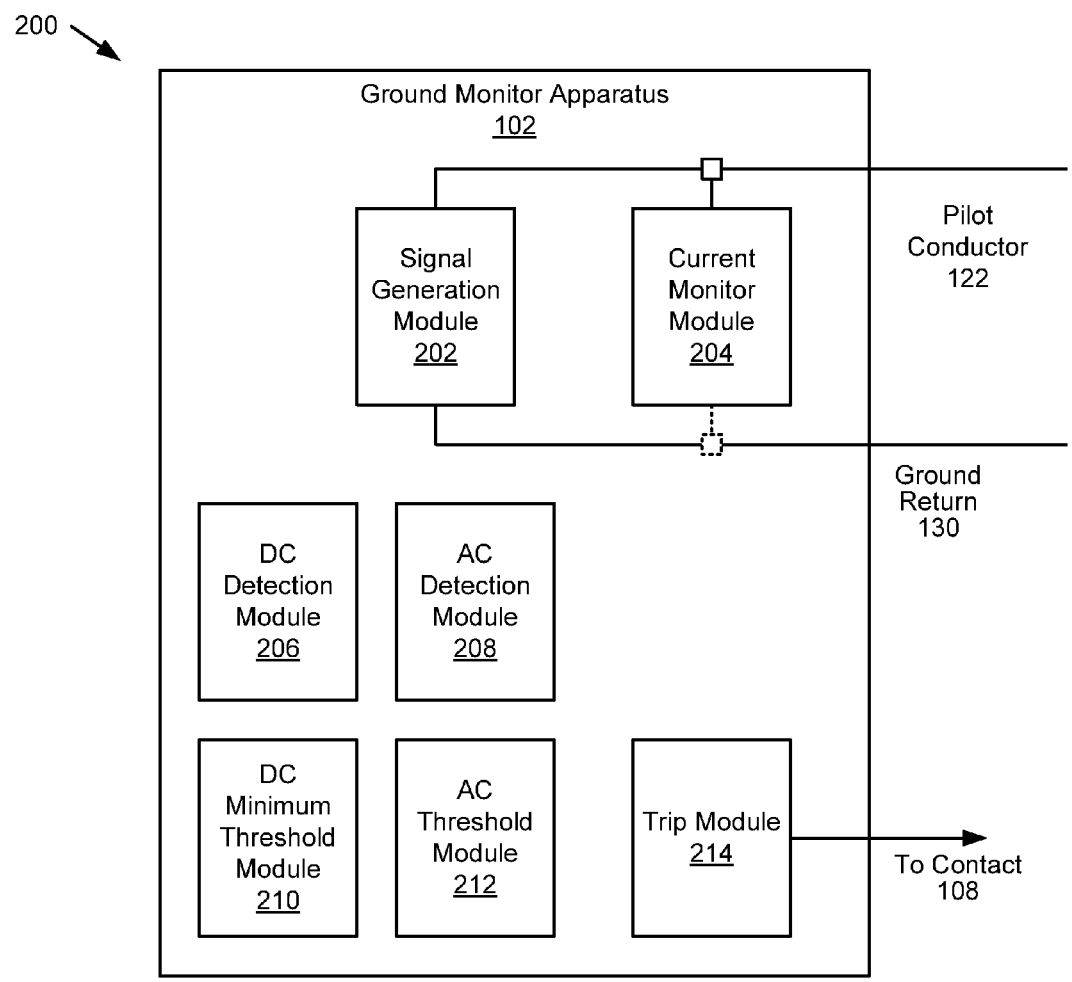
FIG. 2 is a schematic block diagram illustrating one embodiment of an apparatus for ground monitor current sensing in accordance with an embodiment of the present invention.
Figure 3:
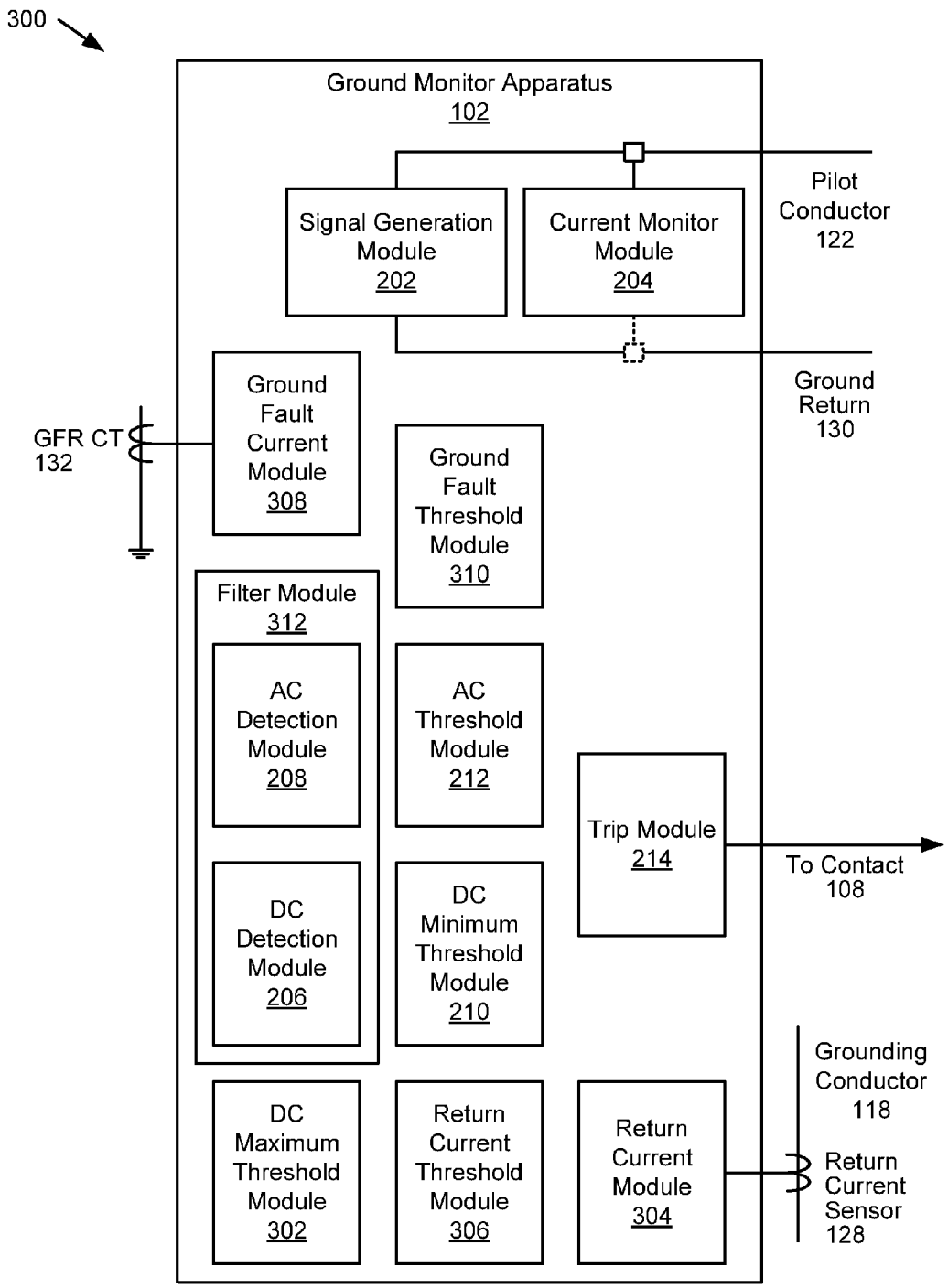
FIG. 3 is a schematic block diagram illustrating another embodiment of an apparatus for ground monitor current sensing in accordance with an embodiment of the present invention.

The system 100 includes, in one embodiment, a ground monitor apparatus 102 that monitors current in the grounding conductor 118, and is described in more detail with regard to the apparatus 200 of FIG. 2, the apparatus 300 of FIG. 3. The power source 104, in one embodiment, includes a three-phase power source 106. In one example, the three-phase power source 106 is a wye-connected source. The three-phase power source 106, in one example, is grounded through a neutral grounding resistor 116. In another embodiment, the three-phase power source 106 may be a delta-connected power source. In another embodiment, the power source 104 includes another type of power source, such as a single-phase power source or a direct current ("DC") power source. The three-phase power source 106 may include some type of a generator, or maybe wired to another source (not shown). In another embodiment, the power source 104 may include multiple power sources. In a particular embodiment, the power source 104 may be configured for an application in a mine. The power source 104, in one embodiment, is configured for mining applications and in another embodiment is configured to meet requirements of the Mine Safety and Health Administration ("MSHA"). One of skill in the art will recognize other power sources 104 that may include a ground monitor apparatus 102.

In one embodiment, the power source 104 includes a relay 108. As used herein, contact and relay are used interchangeably. The relay 108 may include a contact that may be normally open or normally closed and closing or opening the contact may open the relay 108. In one example, the relay 108 is a three-phase contactor. In another example, the relay 108 is a circuit breaker with the remote trip. The relay 108 includes a capability to be commanded open by the ground monitor apparatus 102. The relay 108 may include a fault detection module (not shown) that sends a trip signal to the relay 108 on detection of an overcurrent condition. For example, a fault detection module may include current sensing and/or voltage sensing circuits may indicate an overcurrent or fault condition. The fault detection module may have an inverse time characteristic or other common protective relaying characteristic and may coordinate with other overcurrent protection devices upstream and downstream. The relay 108 may also be opened for other conditions, such as a manual command to open.

In one example, the relay 108 also includes the capability to be commanded open by the ground monitor apparatus 102. For example, the ground monitor apparatus 102 may send a command to open the relay 108 upon detection of a ground problem. In another embodiment, or the power source 104 includes a different type of power source, such as a single phase source, the relay 108 may include a different number of poles. In another example, the relay 108 may be a three-pole contactor. One of skill in the art will recognize other types of relays 108 that may be used in conjunction with the power source 104 that includes a ground monitor apparatus 102.

In one embodiment, the power source 104 includes a relay 108. In one example, the relay 108 is a three-phase contactor. In another example, the relay 108 is a circuit breaker with the remote trip. The relay 108 includes a capability to be commanded open by the ground monitor apparatus 102. The relay 108 may include a fault detection module (not shown) that sends a trip signal to the relay 108 on detection of an overcurrent condition. For example, the fault detection module may include current sensing and/or voltage sensing circuits may indicate an overcurrent or fault condition. The fault detection module may have an inverse time characteristic or other common protective relaying characteristic and may coordinate with other overcurrent protection devices upstream and downstream. The relay 108 may also be opened for other conditions, such as a manual command to open.

In one example, the relay 108 also includes the capability to be commanded open by the ground monitor apparatus 102. For example, the ground monitor apparatus 102 may send a command to open the relay 108 upon detection of a ground problem, such as a ground current different than expected. In another embodiment, or the power source 104 includes a different type of power source, such as a single phase source, the relay 108 may include a different number of poles. In another example, the relay 108 may be a three-pole contactor. One of skill in the art will recognize other types of relays 108 that may be used in conjunction with the power source 104 that includes a ground monitor apparatus 102.

In one embodiment, the system 100 includes a set of power cables wired to a load 120 with a first phase 110, a second phase 112, a third phase 114, and a grounding conductor 118. In other embodiments, the set of power cables may include a neutral conductor (grounded conductor) wired to the load and/or the pilot conductor 122. For safety, it is desirable to determine if the grounding conductor 118 is properly connected between the power source 104 and the load 120. For example, if the grounding conductor 118 is disconnected, has failed, or in some way is not properly connected between the power source 104 and the load 120, there may be a hidden danger within the system 100. For instance, if a short circuit occurs and the grounding conductor 118 is not properly connected, current may flow through the ground from the load 120 to the power source 104 and may generate an electric field within the ground that may cause an electrical hazard for personnel. In one embodiment, the ground monitor apparatus 102 helps to ensure that the grounding conductor 118 is properly connected and functioning.

In one embodiment, the ground monitor apparatus 102 injects a signal into the grounding conductor 118 to sense an undesirable condition, such as a high impedance within the grounding conductor 118, a short between the pilot conductor 122 and ground, or other failure in the grounding conductor 118 or in the ground monitor apparatus 102 and associated components.

In one embodiment, the pilot conductor 122 connects the ground monitor apparatus 102 to the PWD 124 located in the load 120. The PWD 124, in one embodiment, includes one or more diodes, and the pilot conductor 122 is wired to the diodes. A terminal of the PWD 124 may be wired to a chassis ground of the load 120. The grounding conductor 118, in one embodiment, is also connected to the chassis ground of the load 120. In one embodiment, the ground monitor apparatus 102 connects an alternating current ("AC") source to the pilot conductor 122. The PWD 124 may provide a voltage drop which may be used by the ground monitor apparatus 102 to determine a grounding problem. If the PWD 124 fails short, if the pilot conductor 122 is shorted to ground, the current signal changes and the ground monitor apparatus 102 is able to detect the change and open the relay 108.

In an alternate embodiment, the load 120 does not include a PWD 124 with a diode and the pilot conductor 122 connects to chassis ground of the load 120 and to the grounding conductor 118. In the embodiment, the ground monitor apparatus 102 may use a different current sensing scheme than where the PWD 124 with a diode is included. In another embodiment, a DC voltage source injects current into the pilot conductor 122 and the load does not include a PWD 124 with a diode. In another embodiment, a DC voltage source injects current into the pilot conductor 122 and the load includes a PWD 124 with a diode. In the embodiment, the diode in the PWD 124 may be a zener diode with the pilot conductor 122 connected to the cathode the grounding conductor 118 connected to the anode of the zener diode. Various embodiments will be described below with respect to the apparatuses 200, 300, 301 of FIGS. 2, 3A and 3B.

In one embodiment, the power source 104 includes a GWD 126. The GWD 126, in one embodiment, includes a return current sensor 128. In one example, the return current sensor 128 includes a current transformer that senses current in the grounding conductor 118. In another example, the grounding conductor 118 is connected to back to back diodes within the GWD 126, and the back-to-back diodes are also connected to the chassis ground of the power source 104. The back-to-back diodes, in some embodiments, provide some signal isolation for monitoring injected signal in the grounding conductor 118 from the pilot conductor 122. In addition, the back-to-back diodes in the GWD 126 help to keep any voltage on the grounding conductor 118 to within a diode drop of the chassis ground. In another embodiment, a saturable coil may replace the back-to-back diodes.

The saturable coil, in one embodiment, may help keep voltage on the grounding conductor 118 within a saturation voltage of the chassis ground. In another embodiment, the GWD 126 does not include back-to-back diodes but includes a return current sensor 128 and the grounding conductor 118 is connected to chassis ground of the power source 104. In another embodiment, the GWD 126 does not include back-to-back diodes or a return current sensor 128 and the grounding conductor 118 is connected to chassis ground of the power source 104. One skilled in the art will recognize that various other methods exist that can help limit the voltage potential between the grounding conductor 118 and the chassis ground, while providing some signal isolation for monitoring injected signal in the grounding conductor 118. In one embodiment, the system 100 includes a watchdog apparatus 134 in the ground monitor apparatus 102. The watchdog apparatus 134, in one embodiment, determines if the ground monitor apparatus 102 is functioning properly. The watchdog apparatus 134 is discussed in more detail in relation to the apparatuses 600, 700, 800 of FIGS. 6-8.

FIG. 2 is a schematic block diagram illustrating one embodiment of an apparatus 200 for ground monitor current sensing in accordance with an embodiment of the present invention. The apparatus 200 includes a pilot conductor 122, a ground return 130, and a connection to a contact of a relay 108, which are substantially similar to those described above in relation to the system 100 of FIG. 1. The apparatus 200 includes one embodiment of a ground monitor apparatus 102 with a signal generation module 202, a current monitor module 204, a direct current ("DC") detection module 206, an alternating current ("AC") detection module 208, a DC minimum threshold module 210, an AC threshold module 212, and a trip module 214, which are described below.

The apparatus 200 includes an embodiment of a signal generation module 202 that that injects a signal in the pilot conductor 122. In one embodiment, the signal generation module 202 connects to the pilot conductor 122 and ground return 130. The signal generated by the signal generation module 202 includes a DC component and one or more AC components. The DC component may include a DC voltage that is higher than a peak voltage of the one or more AC components. For example, if an AC component includes a sinusoidal waveform with a peak voltage of 5 volts ("V"), the DC component may be 7 V. In another embodiment, the DC component is zero volts or substantially zero volts. For example, the DC component may be 0.1 V, 0.5 V, or other voltage that is substantially zero or close to zero or a voltage substantially less than a peak voltage of an AC component.

Each AC component of the one or more AC components includes a frequency different from other AC components of the one or more AC components. Current in the pilot conductor 122 is injected in the grounding conductor of the set of power cables connecting the power source 104 to the load 120 and the grounding conductor 118 of the set of power cables is connected to the ground return 130. In one embodiment, the one or more AC components are sinusoidal waveforms of different frequencies. In one embodiment, the one or more AC components are three AC components of different frequencies. In another embodiment, four or more AC components are generated by the signal generation module 202.

In one embodiment, each of the AC components generated by the signal generation module 202 has a fundamental frequency that is not a harmonic of the fundamental frequency of an AC voltage generated by the power source 104. For example, the power source 104 may generate 60 hertz ("Hz"), 120 Hz, 400 Hz, etc. Where the power source 104 produces power at 60 Hz, the AC components generated by the signal generation module 202 may be 85 Hz, 208 Hz, and 990 Hz, which are not harmonic frequencies of 60 Hz. In one embodiment, the AC components have a fundamental frequency that differs significantly from harmonic frequencies of the fundamental frequency of the power source 104.

The apparatus 200 includes, in one embodiment, a current monitor module 204 that monitors current in at least the pilot conductor 122 or the ground return 130 or both. For example, the current monitor module 204 may monitor current in the pilot conductor 122. In another embodiment, the current monitor module 204 monitors current in the ground return 130. In one embodiment, in normal situations current in the pilot conductor 122 is substantially the same as current in the ground return 130. In another embodiment, the current monitor module 204 monitors current in both the pilot conductor 122 and ground return 130, for example for redundancy. The current monitor module 204 may use a Hall Effect current sensor, a current transformer, a resistor, or other current sensing method known to those of skill in the art. In one embodiment, the current monitor module 204 includes current sensing capable of monitoring AC and DC current. In one embodiment, the current monitor module 204 creates a voltage representative of current in the pilot conductor 122 or ground return 130. When referring to current monitored by the current monitor module 204, one of skill in the art will recognize that the current monitor module 204 may use a voltage signal and modules using the current monitored by the current monitor module 204 may use one or more voltage signals representing current in the pilot conductor 122/ground return 130. Thus the current monitor module 204 includes a capability to monitor the DC component and the one or more AC components.

The apparatus 200, in one embodiment, includes a DC detection module 206 that determines a DC current present in the current monitored by the current monitor module 204 and an AC detection module 208 that determines an AC current corresponding to each frequency of the one or more AC components present in the current monitored by the current monitor module 204. For example, the DC detection module 206 may determine a DC current present in the pilot conductor 122 or ground return 130. In one embodiment, the DC detection module 206 includes filtering to filter DC current from the current monitored by the current monitor module 204. For example, the DC detection module 206 may include a low pass filter that substantially removes AC content from the current monitored by the current monitor module 204. One of skill in the art will recognize other ways for the DC detection module 206 to determine DC current present in the current monitored by the current monitor module 204.

In one embodiment, The AC detection module 208 determines an AC current corresponding to each frequency of the one or more AC components present in the current monitored by the current monitor module 204 by filtering the DC component from the monitored current and detecting each frequency separately. For example, the AC detection module 208 may include filters to determine each frequency. In one embodiment, the AC detection module 208 uses one or more comb filters tuned to the frequencies of the AC components. In another embodiment, the AC detection module 208 uses one or more band pass filters that pass the frequencies of the AC components while eliminating other frequencies. In another embodiment, the AC detection module 208 uses one or more notch filters. In another embodiment, the AC detection module 208 uses a combination of the above mentioned filters. For example, the AC detection module 208 may use a comb filter tuned to each frequency of the AC components and may then include band pass filters and notch filters to further isolate the frequencies of the AC components. Resulting waveforms may then have a specific amplitude for each. One of skill in the art will recognize other ways for the AC detection module 208 to determine an AC current, which may be represented as a voltage, corresponding to each frequency of the one or more AC components.

The apparatus 200, in one embodiment, includes a DC minimum threshold module 210 that determines if the DC current is below a DC current minimum threshold. For example, the DC minimum threshold module 210 may include a comparator that compares the DC current determined by the DC detection module 206 with a DC current minimum threshold. The DC minimum threshold module 210 may use other circuits as well to determine of the DC current is below a DC current minimum threshold. In another embodiment, the DC current minimum threshold module 210 may include redundant circuitry and may determine if the DC current is below a first DC current minimum threshold and a second DC current minimum threshold. The first and the second DC minimum thresholds may be the same or different. Redundancy may be used to increase reliability.

In one embodiment, the DC current minimum threshold corresponds to a combined pilot conductor 122 and grounding conductor 118 resistance of less than 50 ohms. In another embodiment, the DC current minimum threshold corresponds to a combined pilot conductor 122, grounding conductor 118, and ground return 130 resistance of less than 50 ohms. Fifty ohms corresponds to an MSHA requirement and the DC current minimum threshold may be set to correspond to 50 ohms or less. For example, if the DC component is a particular voltage, the DC current minimum threshold may correspond to the DC component voltage divided by 50 ohms or a lower resistance. In one embodiment, the trip module 214 opens the contact 108 when the DC current is below the DC minimum current threshold such that if resistance of the pilot conductor 122, grounding conductor 118, and ground return exceeds a value of 50 ohms or some resistance value just under 50 ohms, the trip module 214 opens the contact 108. A first DC current minimum threshold may correspond to 45 ohms and a second DC current minimum threshold may correspond to 48 ohms.

In another embodiment, the apparatus 200 includes an AC threshold module 212 that determines if one or more of the AC currents determined by the AC detection module is below an AC threshold. In one embodiment, the AC threshold module 212 uses a single AC threshold for each AC current corresponding to an AC component. In another embodiment, the AC threshold module 212 uses a different AC threshold for each AC current corresponding to an AC component. Note that some of the AC thresholds for the AC currents for the various AC components may be the same.

In one embodiment, the AC threshold module 212 uses a peak current to compare to an AC threshold. In another embodiment, the AC threshold module 212 uses a root-mean-square ("RMS") of the current to compare to an AC threshold. The AC threshold module 212 may use one or more comparators or circuits with a similar function to determine if one or more of the AC currents is below one or more AC thresholds. In another embodiment, the AC current may be digitized and the AC threshold module 212 may digitally compare one or more of the AC currents to one or more AC thresholds. In another embodiment, the AC threshold module 212 includes redundant circuitry so that for each current corresponding to an AC component, there are at least two comparators or similar circuitry. One of skill in the art will recognize other ways for the AC threshold module 212 to determine if one or more of the AC currents is below an AC threshold.

The apparatus 200, in one embodiment, includes a trip module 214 that opens a contact 108 in response to the DC threshold module determining that the DC current is below the DC current minimum threshold longer than a DC current minimum time threshold and/or the AC threshold module determining that at least one of the AC currents is below an AC threshold for longer than an AC current time threshold. The contact 108 disconnects the power source 104 from the set of power cables. Note that use of the phrase "opens a contact 108" may include closing a normally open contact and/or opening a normally closed contact that is part of the relay 108 such that the power source 104 is disconnected from the set of power cables to the load 120.

The DC current minimum time threshold may be zero or substantially zero or may be an appreciable amount of time. For example, the DC current minimum time threshold may be set to zero while a time may elapse between sending a signal and actual opening due to typical circuit delay time while the delay is unintentional. In another embodiment, the DC current minimum time threshold may be set to a value that accounts for transient conditions, motor start times, downstream overcurrent device reaction time, or other delay known to those of skill in the art. Likewise the AC current time threshold may be zero, substantially zero, or another time and each AC component may have the same or a different AC current time threshold.

In one embodiment, the trip module 214 opens the contact 108 in response to one of the DC threshold module determining that the DC current is below the DC current minimum threshold longer than a DC current minimum time threshold and the AC threshold module determining that an AC current is below an AC threshold for longer than an AC current time threshold. In another embodiment, the trip module 214 opens the contact 108 in response to some combination of the DC threshold module determining that the DC current is below the DC current minimum threshold longer than a DC current minimum time threshold and the AC threshold module determining that at least one or more of the AC currents is below an AC threshold for longer than an AC current time threshold.

In one embodiment, the apparatus 200 includes multiple DC current minimum thresholds and multiple AC current minimum thresholds for each AC component and the trip module 214 reacts differently depending upon which threshold or thresholds are crossed. For example, certain AC or DC current minimum thresholds may cause the trip module 214 to open the contact 108 without any other condition where other AC or DC current minimum thresholds may require some combination of threshold crossings to open. In other embodiments, certain AC or DC current minimum thresholds may merely trigger an alert while others may cause the trip module 214 to open the contact 108.

In one embodiment, the trip module 214 opens the contact 108 in response to the AC threshold module 212 determining that for at least two of the AC currents, an AC current is below an AC threshold for longer than a first AC current time threshold. In a further embodiment, the signal generation module 202 generates three AC components and the trip module 214 further opens the contact 108 in response to the AC threshold module 212 determining that each of the three AC currents is below an AC threshold for longer than a second AC current time threshold. In one embodiment, the first AC current time threshold is longer than the second AC current time threshold. For example, the first AC current time threshold may be 250 milliseconds ("mS") and the second AC current time threshold may be 150 mS.

FIG. 3 is a schematic block diagram illustrating another embodiment of an apparatus 300 for ground monitor current sensing in accordance with an embodiment of the present invention. The apparatus 300 includes a pilot conductor 122, a ground return 130, a connection to a contact of a relay 108, a grounding conductor 118, a return current sensor 128, and a GFR CT 132, which are substantially similar to those described above in relation to the system 100 of FIG. 1 and one embodiment of a ground monitor apparatus 102 with a signal generation module 202, a current monitor module 204, a direct current ("DC") detection module 206, an alternating current ("AC") detection module 208, a DC minimum threshold module 210, an AC threshold module 212, and a trip module 214, which are substantially similar to those described in relation to the apparatus 200 of FIG. 2. The apparatus 300 includes, in various embodiments, a DC maximum threshold module 302, a return current module 304, a return current threshold module 306, a ground fault current module 308, and a ground fault threshold module 310, which are described below.

The apparatus 300, in one embodiment, includes a DC maximum threshold module 302 that determines if the DC current, determined by the DC detection module 206, is above a DC current maximum threshold. In one embodiment, the trip module 214 also opens the contact 108 in response to the DC maximum threshold module 302 determining that the DC current is above the DC maximum current threshold. In some circumstances, the grounding conductor 118 or other circuit of the system 100 may include stray DC voltage and/or current that may increase the DC current component of the current in the pilot conductor 122 or ground return 130 monitored by the current monitor module 204 and the DC detection module 206 may determine that the DC current is above a DC current maximum threshold. In one example, the DC current maximum threshold is set at a level that corresponds to a current that is above a DC current in the pilot conductor 122 or ground return 130 that is at a level indicative of an operating condition without a stray DC current component.

In one embodiment, the PWD 124 includes one or more diodes such that the PWD 124 has a particular voltage drop when the signal is applied to the pilot conductor 122. For example, the PWD 124 may include a zener diode with a specific breakdown voltage. In another example, the PWD 124 includes one diode or two or more diodes in series oriented to conduct current injected in the pilot conductor 122. The diodes include a voltage drop. A number of diodes may be used to create a desired voltage drop across the PWD 124 during normal operation. In one embodiment, the DC current maximum threshold corresponds to a current that is above a DC current in the pilot conductor 122 or ground return 130 when the load 120 includes a properly functioning PWD 124. For example, if the voltage drop across the PWD 124 is 5 V, the DC current maximum threshold may be 7 V.

The apparatus 300, in one embodiment, includes a return current module 304 that determines a current in the grounding conductor 118, and a return current threshold module 306 that determines if the current in the grounding conductor 118 is below a return current threshold. In the embodiment, the trip module 214 also opens the contact 108 in response to the return current threshold module 306 determining that the current in the grounding conductor 118 is below the return current threshold for a period longer than a return current time threshold. In one example, the return current module 304 includes a return current sensor 128 positioned to determine current in the grounding conductor 118.

The return current sensor 128, in one embodiment, is a current transformer. The return current sensor 128, in one embodiment, is in the GWD 126 and monitors current before the grounding conductor 118 connects to one or more diodes connected to a chassis ground. In another embodiment, return current sensor 128 is a Hall-Effect sensor. In another embodiment, the return current sensor 128 includes a resistor and voltage across the resistor is proportional to current in the grounding conductor 118. One of skill in the art will recognize other types of return current sensors 128 capable of measuring current in the grounding conductor 118. The return current module 304 may also include other circuitry, such as resistors, capacitors, op amps, etc. known to those of skill in the art.

In one embodiment, the return current threshold may be a value that represents current just below a current level for the signal injected in the pilot conductor 122 during typical operation. In a circumstance where the signal generation module 202 injects a signal and current in the grounding conductor 118 is below an expected current, which is above the return current threshold, this condition may represent a situation where there is a break or higher impedance somewhere in the circuit formed by the pilot conductor 122, the PWD 124 (where included), and the grounding conductor 118 and all or a portion of the current of the signal injected by the signal generation module 202 may be returning through an alternate ground path. In one embodiment, the return current time threshold is zero or substantially zero, for example where the return current time threshold is set to not include any intentional delay. In another embodiment, the return current threshold is set to a value greater than zero. The return current threshold may be set to a value longer than expected transients or other condition where opening the contact 108 may be undesirable. One of skill in the art will recognize other appropriate values for the return current time threshold.

In one embodiment, the apparatus 300 includes a ground fault current module 308 that determines a current in a connection between a ground of the power source 104 and a chassis ground of the power source 104. For example, the power source 104 may include a connection to chassis ground and the ground fault current module 308 may determine current in the connection. In one embodiment, the ground connection of the power source 104 may include a neutral grounding resistor 116. The ground fault current module 308 may monitor current through the neutral grounding resistor 116 or in conductors between a ground of the power source 104 and a chassis ground. In one embodiment, the chassis ground is also an earth ground. The neutral grounding resistor 116, in some embodiments, is sized to limit current during a fault condition to below a specified value. For example, where the power source 104 is for mining equipment, the neutral grounding resistor 116 may be sized to limit current during a fault to a level specified by MSHA.

In one embodiment, the ground fault current module 308 measures current by measuring voltage across the neutral grounding resistor 116. In another embodiment, the ground fault current module 308 measures current using a current transformer, such as the GFR CT 132 depicted in FIG. 1. In another embodiment, the ground fault current module 308 includes other circuitry to provide a signal useful to the ground fault threshold module 310, such as a voltage proportional to current in the connection between the ground of the power source 104 and the chassis ground.

The apparatus 300 includes, in one embodiment, a ground fault threshold module 310 that determines if the current determined by the ground fault module 308 is above a ground fault threshold. The trip module 214 also opens the contact 108 in response to the ground fault threshold module 310 determining that the current determined by the ground fault current module 308 is above the ground fault threshold for a period longer than a ground fault time threshold. In one embodiment, the ground fault threshold is zero or substantially zero, for example where the ground fault threshold is set to zero without any intentional delay. In another embodiment, the ground fault threshold is set to a value higher than zero. The ground fault threshold may be used to coordinate with other ground fault trip settings of downstream overcurrent protection devices, may be set to account for acceptable transient conditions, etc. The return current threshold module 306 and the ground fault threshold module 310 may include comparators, op amps, etc. to compare a current signal with a threshold.

In one embodiment, the apparatus 300 includes a filter module 312 that that separates each of the DC component and the one or more AC components from each other. For example, the filter module 312 may include the DC detection module 206 and the AC detection module 208 and may include a comb filter, band pass filters, etc. as mentioned above in relation to the DC detection module 206 and the AC detection module 208. In one embodiment, the filter module 312 substantially removes a power source fundamental AC component and harmonics of the power source fundamental AC component from within the one or more AC components of the current monitored by the current monitor module 204. For example, the fundamental AC component of the power source 104 may be 60 Hz and the filter module 312 may remove 60 Hz and harmonics of 60 Hz.

Figure 4:
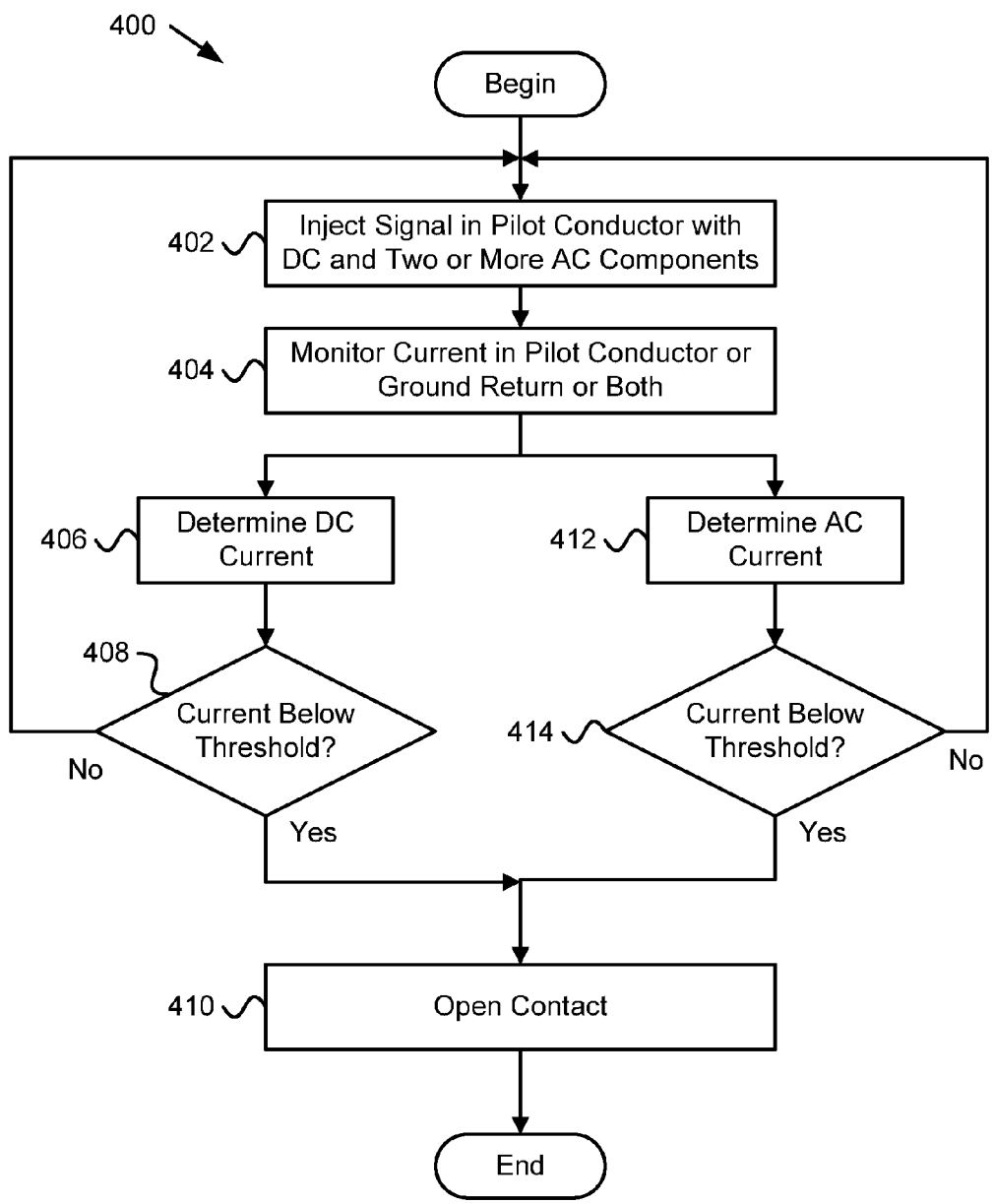
FIG. 4 is a schematic block diagram illustrating one embodiment of a method for ground monitor current sensing in accordance with an embodiment of the present invention.

FIG. 4 is a schematic block diagram illustrating one embodiment of a method 400 for ground monitor current sensing in accordance with an embodiment of the present invention. The method 400 begins and injects 402 a signal in a pilot conductor 122. The signal includes a DC component and one or more AC components. Each AC component has a frequency different from other AC components. As depicted in FIG. 1, current in the pilot conductor 122 is injected in the grounding conductor 118 of a set of power cables connecting the power source 104 to the load 120. Also, the grounding conductor 118 connects to the ground return 130. In one embodiment, the signal generation module 202 injects 402 the signal in the pilot conductor 122. The method 400 monitors 404 current in the pilot conductor 122, the ground return 130, or both. The current monitor module 204, in one embodiment, monitors 404 the current. The method 400 determines 406 a DC current present in the monitored current and determines 408 if the DC current is below a DC current minimum threshold. In one embodiment, the DC detection module 206 determines the DC current present in the current monitored 404 by the current monitor module 204 and the DC minimum threshold module 210 determines 408 if the DC current is below a DC current minimum threshold.

If the method 400 determines 408 that the DC current is not below a DC current minimum threshold, the method 400 returns and continues to inject 402 a signal in the pilot conductor 122. If the method 400 determines 408 that the DC current is below a DC current minimum threshold, the method 400 opens 410 the contact 108, and the method 400 ends. The method 400 determines 412 an AC current corresponding to each frequency of the one or more AC components present in the monitored current and determines 414 if one or more of the AC currents is below an AC threshold. If the method 400 determines 414 that one or more of the AC currents is not below an AC threshold, the method 400 returns and continues to inject 402 a signal in the pilot conductor 122. If the method 400 determines 414 that one or more of the AC currents is below an AC threshold, the method 400 opens 410 the contact 108, and the method 400 ends. The DC detection module 206, the AC detection module 208, the DC minimum threshold module 210, and the AC threshold module 212 may be used in determining DC and AC components and if the DC and AC components are below thresholds.

Figure 5:
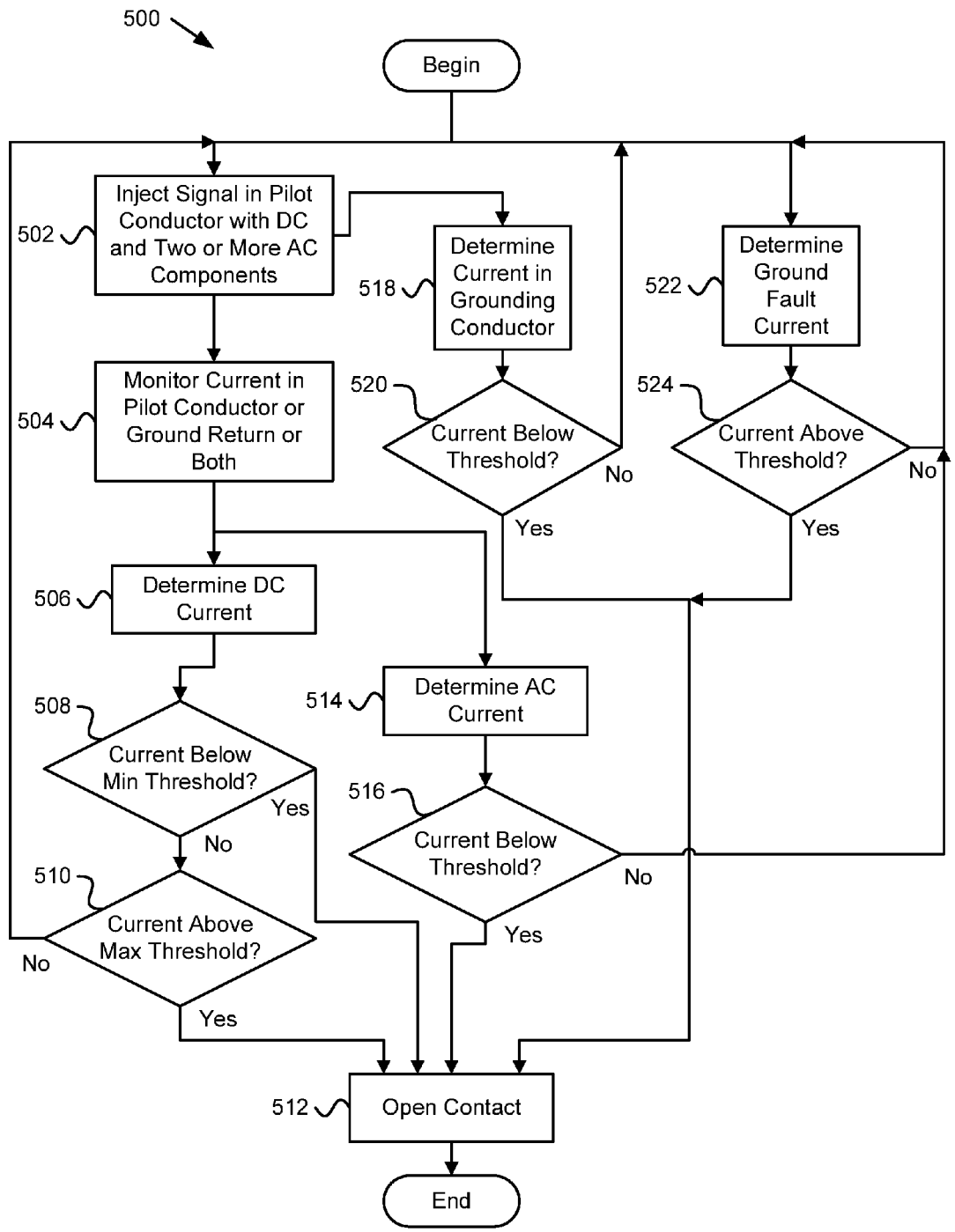
FIG. 5 is a schematic block diagram illustrating another embodiment of a method for ground monitor current sensing in accordance with an embodiment of the present invention.

FIG. 5 is a schematic block diagram illustrating another embodiment of a method 500 for ground monitor current sensing in accordance with an embodiment of the present invention. The method 500 begins and injects 502 a signal in a pilot conductor 122. The signal includes a DC component and one or more AC components. Each AC component has a frequency different from other AC components. The method 500 monitors 504 current in the pilot conductor 122, the ground return 130, or both. The method 500 determines 506 a DC current present in the monitored current and determines 508 if the DC current is below a DC current minimum threshold. If the method 500 determines 508 that the DC current is below a DC current minimum threshold, the method 500 opens 512 the contact 108. If the method 500 determines 508 that the DC current is not below a DC current minimum threshold, the method 500 determines 510 if the DC current is above a DC current maximum threshold. If the method 500 determines 510 that the DC current is not above the DC current maximum threshold, the method 500 returns and continues to inject 502 a signal in the pilot conductor 122. If the method 500 determines 510 that the DC current is above the DC current maximum threshold, the method 500 opens 512 the contact 108. The DC maximum threshold module 302 may be used to determine 510 if the DC current is above the DC current maximum threshold.

The method 500 determines 514 an AC current corresponding to each frequency of the one or more AC components present in the monitored current and determines 516 if one or more of the AC currents is below an AC threshold. If the method 500 determines 516 that one or more of the AC currents is not below an AC threshold, the method 500 returns and continues to inject 502 a signal in the pilot conductor 122. If the method 500 determines 516 that one or more of the AC currents is below an AC threshold, the method 500 opens 512 the contact 108.

The method 500 determines 518 a current in the grounding conductor 118 and determines 520 if the current in the grounding conductor 118 is below a return current threshold. If the method 500 determines 520 that the current in the grounding conductor 118 is not below the return current threshold, the method 500 returns and continues to inject 502 a signal in the pilot conductor 122. If the method 500 determines 520 that the current in the grounding conductor 118 is below the return current threshold, the method 500 opens 512 the contact 108. The return current module 304 and the return current threshold module 306 may be used to determine 518 current in the grounding conductor 118 and to determine 520 if the current in the grounding conductor 118 is below a return current threshold.

The method 500 determines 522 a current in a connection between a ground of the power source 104 and a chassis ground of the power source 104 and determines 524 if the ground current is above a ground fault threshold. If the method 500 determines 524 that the ground current is not above a ground fault threshold, the method 500 returns and continues to inject 502 a signal in the pilot conductor 122. If the method 500 determines 524 that the ground current is above a ground fault threshold, the method 500 opens 512 the contact 108, and the method 500 ends. The ground fault current module 308 and the ground fault threshold module 310 may be used to determine 522 a current in the connection between the ground of the power source 104 and the chassis ground of the power source 104 and to determine 524 if the ground current is above a ground fault threshold.

Figure 6:
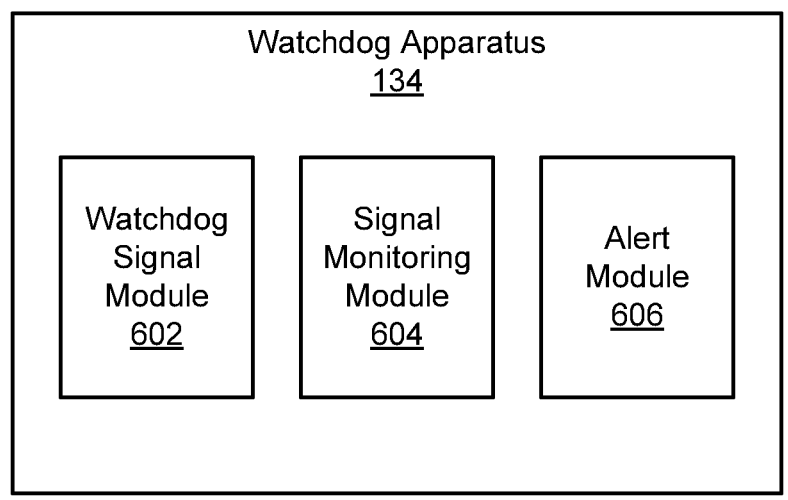
FIG. 6 is a schematic block diagram illustrating one embodiment of a watchdog apparatus in accordance with an embodiment of the present invention.

FIG. 6 is a schematic block diagram illustrating one embodiment 600 of a watchdog apparatus 134 in accordance with an embodiment of the present invention. The watchdog apparatus 134 includes a watchdog signal module 602, a signal monitoring module 604, and an alert module 606, which are described below. In one embodiment, the watchdog apparatus 134 determines if a device, such as a microprocessor or a device capable of generating a signal, is functioning properly. The device may be part of a computing device, a smartphone, an appliance, or any other device where monitoring functionality of a microprocessor or similar device would be beneficial. In one embodiment, the watchdog apparatus 134 is part of the ground monitor apparatus 102, and the watchdog apparatus 134 monitors functionality of the ground monitor apparatus 102. In one embodiment, the ground monitor apparatus 102 with the watchdog apparatus 134 complies with MSHA testing standard 30 the Code of Federal Regulations ("C.F.R.") section 75, 30 C.F.R. section 77, American Society for Testing and Materials ("ASTP") standard 2135, and/or MSHA document number ACRI 2003. Typical ground monitors fail to comply with these standards. The ground monitor apparatus 102 described herein is designed to meet these standards.

In one embodiment, the watchdog apparatus 134 includes a watchdog signal module 602 that generates a watchdog signal. The watchdog signal is generated at a specific interval and includes an identifiable characteristic. The watchdog signal module is part of a device being monitored for functionality. For example, the identifiable characteristic may be a pulse with a particular pulse width. The pulse may occur at a specific interval or frequency. In one embodiment, each pulse includes the same identifiable characteristic. In another example, the identifiable characteristic is a digital pattern and the digital pattern is generated periodically.

In another embodiment, the identifiable characteristic includes a pulse that fits within a specific frequency range. Additional frequencies could be included with a carrier frequency. In another embodiment, the identifiable characteristic includes a pulse with a particular pattern of highs and lows (i.e. ones and zeros) that is periodically broadcast. In another embodiment, the identifiable characteristic includes an analog signal coming from a digital-to-analog converter ("DAC") with a specific, measurable characteristic, such as multiple tones at different frequencies. One of skill in the art will recognize other identifiable characteristics that may be included in a signal that may be used to determine that a device is functioning.

In one embodiment, the watchdog signal module 602 is included within a device being monitored while the signal monitoring module 604 is external to the monitored device but internal to a device controlled and/or powered by the monitored device. For example, the monitored device may be a microprocessor in a computer and the watchdog signal module 602 is in the microprocessor while the signal monitoring module 604 and possibly the alert module 606 is within the computer and external to the microprocessor. In another embodiment, the watchdog signal module 602 is in a processor in the ground monitor apparatus 102 while the signal monitoring module 604 and at least a portion of the alert module 606 are external to the processor but within the ground monitor apparatus 102.

In one embodiment, the watchdog apparatus 134 includes a signal monitoring module 604 that determines if the watchdog signal includes the identifiable characteristic. For example, if the identifiable characteristic is a pulse of a specific width, the signal monitoring module 604 can determine if the pulse width is as expected. If the watchdog signal includes specific frequencies, the signal monitoring module 604 can determine if the specific frequencies are present. If the watchdog signal is a digital pattern, the signal monitoring module 604 can determine if the digital pattern is present in the watchdog signal. Typically, if the monitored device is malfunctioning, there is a good chance that the watchdog signal will vary from the identifiable characteristic.

In one embodiment, the watchdog apparatus 134 includes an alert module 606 that sends and alert signal in response to the signal monitoring module 604 determining that the watchdog signal does not include the identifiable characteristic. The alert signal may include a message to a particular device. In another embodiment, the alert signal includes triggering an action, such as a reset or a shutdown of the monitored device or the device that includes the modules 602-606. In another embodiment, the alert signal is used to trigger an action external to the device that includes the modules 602-606. For example, if the device is the ground monitor apparatus 102, the alert signal may be a trip signal that opens the contact 108 to disconnect the power source 104 from the load 120. In another embodiment, the alert signal may include one or more messages, notifications, etc. as well as triggering some action like opening the contact 108 or shutting down a processor.

Figure 7:
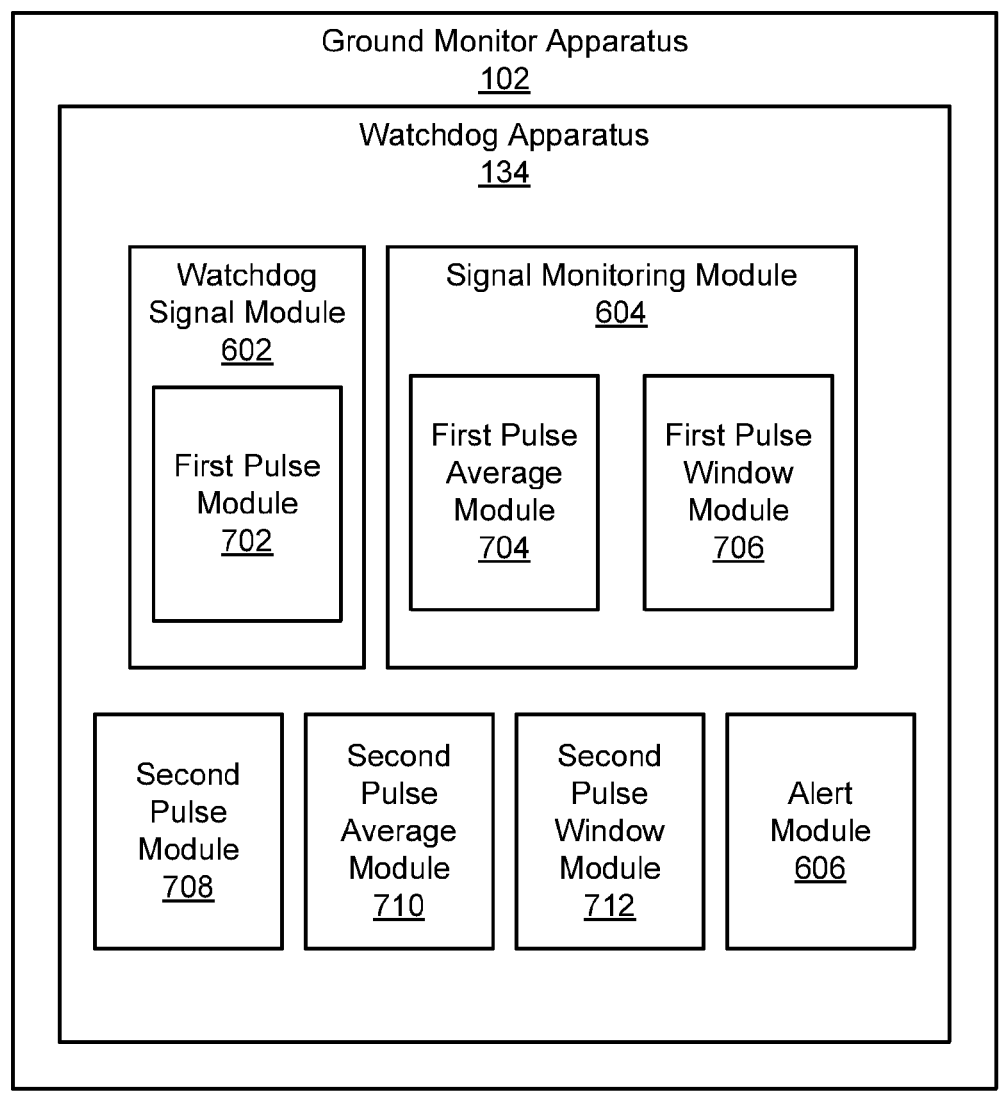
FIG. 7 is a schematic block diagram illustrating another embodiment of a watchdog apparatus in accordance with an embodiment of the present invention.

FIG. 7 is a schematic block diagram illustrating another embodiment 700 of a watchdog apparatus 134 in accordance with an embodiment of the present invention. The embodiment 700 of the watchdog apparatus 134 in a ground monitor apparatus 102 and the watchdog apparatus 134 includes a watchdog signal module 602 with a first pulse module 702, a signal monitoring module 604 with a first pulse average module 704 and a first pulse window module 706, and an alert module 606, which is substantially similar to the alert module 606 described in relationship with the embodiment 600 of FIG. 6. In various embodiments, the watchdog apparatus 134 may also include a second pulse module 708, a second pulse average module 710, and a second pulse window module 712, which are described below.

In one embodiment, an embodiment 700 of the watchdog apparatus 134 includes a watchdog signal module 602 with a first pulse module 702 that generates a first pulse signal of a first frequency. The first pulse signal includes a pulse of a first pulse width. The watchdog signal includes, in this embodiment, the first pulse signal. The first pulse module 702, in one embodiment, is included in a device that is being monitored by the watchdog apparatus 134. For example, the first pulse module 702 may be included in a processor. The processor, in one embodiment, is in the ground monitor apparatus 102.

The first pulse includes a first pulse width that is typically less than the period of the first frequency. The first pulse module 702 generates a first pulse at the first frequency. For example, if the first frequency is 10 kilohertz ("kHz"), the period for this frequency is 100 microseconds and the first pulse module generates a first pulse every 100 microseconds. The first pulse width is then less than 100 microseconds. For example, if the first pulse width is 40 microseconds, an output of the first pulse module 702 may be high for 40 microseconds and low for 60 microseconds for each period of the first frequency.

In one embodiment, the watchdog apparatus 134 includes a first pulse average module 704 that determines a first pulse average. The first pulse average includes an average level of one or more periods of the first pulse signal. For example, where the first pulse is 40 microseconds and the first frequency is 10 kHz, the first pulse average may be 40%. The first pulse average, in one embodiment, is expressed as a voltage. For example, if the first pulse is 5 V for 40 microseconds and 0 V for 60 microseconds, the first pulse average may be 40% of 5 V, or 2 V. in other embodiments, other high and low voltages may be used and the first pulse average may differ. One of skill in the art will recognize other ways to average the first pulse signal. In one embodiment, the first pulse average module 704 determines a first pulse average for each period of the first switching frequency. In another embodiment, the first pulse average module 704 averages two or more first pulse signals. Averaging more than one first pulse signals may reduce variations due to transients and noise.

In another embodiment, the watchdog apparatus 134 includes a first pulse window module 706 that determines if the first pulse average is between a first pulse maximum threshold and a first pulse minimum threshold. For example, where the first pulse average is 40%, the first pulse maximum threshold may be 50% and the first pulse minimum threshold may be 30%. Where the first pulse average is 2 V, the first pulse maximum threshold may be 2.5 V and the first pulse minimum threshold may be 1.5V. Where the first pulse average is determined by the first pulse average module 704 to be below 1.5V or above 2.5 V, the first pulse window module 706 may determine that the first pulse average is outside of an allowable window of 1.5V to 2.5 V. The alert module 606 then sends an alert signal when the first pulse window module 706 determines that the first pulse average is not between the first pulse maximum threshold and the first pulse minimum threshold.

In one embodiment, an embodiment 700 of the watchdog apparatus 134 includes a second pulse module 708, a second pulse average module 710, and a second pulse window module 712. The second pulse module 708 generates a second pulse signal of a second frequency and the second pulse signal includes a pulse of a second pulse width. The second pulse module 708 generates a second pulse signal that is independent of the first pulse signal. In other words, the second pulse signal is generated in a way to be separate from the first pulse signal, such as on a different pin of a processor than the first pulse signal. Having a second pulse signal may provide a more fault tolerant design than an embodiment where only a first pulse signal is generated. For example, if a pin on a processor where the first pulse signal is available is shorted, the second pulse signal may be available.

In one embodiment, the first pulse width is the same as the second pulse width. In another embodiment, the first pulse width and the second pulse width are different. In another embodiment, the second pulse width is a compliment or an inversion of the first pulse width. For example, if the first pulse width is 40 microseconds starting at the beginning of a period, the second pulse width may be 60 microseconds starting 40 microseconds into the period. The first frequency may be the same or different than the second frequency.

The second pulse average module 710 determines a second pulse average that includes an average level of one or more periods of the second pulse signal, and the second pulse window module 712 determines if the second pulse average is between a second pulse maximum threshold and a second pulse minimum threshold. The second pulse average module 710 and the second pulse window module 712, in one embodiment, operate similarly to the first pulse average module 704 and the second pulse window module 712 except function with the second pulse signal. In one embodiment, the second pulse average module 710 and the second pulse window module 712 operate independently from the first pulse average module 704 and the second pulse window module 712, which may increase fault tolerance.

Figure 8:
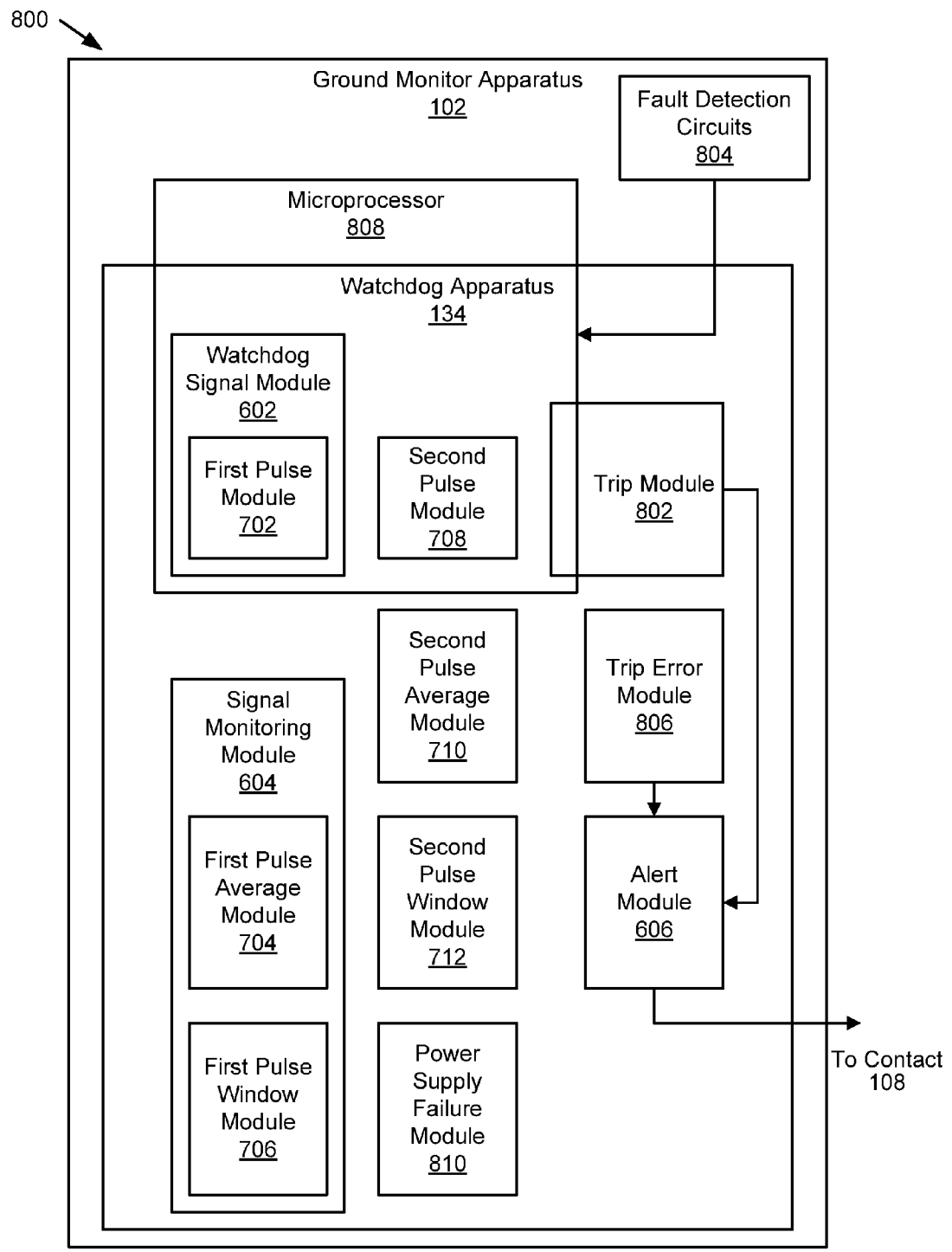
FIG. 8 is a schematic block diagram illustrating a third embodiment of a watchdog apparatus in accordance with an embodiment of the present invention.

FIG. 8 is a schematic block diagram illustrating a third embodiment 800 of a watchdog apparatus 134 in accordance with an embodiment of the present invention. In the embodiment, the watchdog apparatus 134 is in the ground monitor apparatus 102 and includes a watchdog signal module 602 with a first pulse module 702 and a signal monitoring module 604 with a first pulse average module 704 and a first pulse window module 706, an alert module 606, a second pulse module 708, a second pulse average module 710, and a second pulse window module 712, which are substantially similar to those described in relation to the embodiment 700 of the watchdog apparatus 134 in FIG. 7. The embodiment 800 of the watchdog apparatus 134 also includes, in various embodiments, a trip module 802, a trip error module 806, a microprocessor 808, and a power supply failure module 810, and the ground monitor apparatus 102 includes a fault detection circuits 804, which are described below.

In one embodiment, the watchdog apparatus 134 includes a trip module 802 that generates a trip signal. The trip module 802 generates the trip signal in response to a fault condition in the power source 104 providing power to the load 120. For example, fault detection circuits 804 in the ground monitor apparatus 102 or other overcurrent protection device may detect a fault, such as unexpected current in the grounding conductor 118, less current or different current than expected, overcurrent, or other function where the ground monitor apparatus 102 would generate a trip signal may cause the trip module 802 to generate a trip signal. In one embodiment, the trip module 802 of the apparatus 800 of FIG. 8 is the same as the trip module 214 of the system 100 of FIG. 1 and apparatuses 200, 300 of FIGS. 2 and 3. For example, the trip module 214 of the system 100 of FIG. 1 and apparatuses 200, 300 of FIGS. 2 and 3 may include the functionality of the trip module 802 of the apparatus 800 of FIG. 8 along with functionality described in relation to the system 100 of FIG. 1 and apparatuses 200, 300 of FIGS. 2 and 3.

In the embodiment, the trip signal includes an active high signal and an active low signal where the active high signal transitions from low to high when the trip module 802 generates the trip signal and the active low signal transitions from high to low when the trip module 802 generates the trip signal. The alert module 606 sends the alert signal in response to the active high signal transitioning high and/or the active low signal transitioning low. Having an active high signal and an active low signal may provide a more fault tolerant watchdog apparatus 134.

In one embodiment, the watchdog apparatus 134 includes a trip error module 806 that sends a trip error signal in response to determining that the active high signal and the active low signal are both simultaneously high or both simultaneously low for a predetermined amount of time. For example, if the active high signal is low when it should be high and the active low signal is low, this condition may signal a fault condition, such as the active high line of the trip signal is shorted. Similarly, if the active high signal remains low when it should transition high and the active low signal transitions low, then again both the active high and the active low signals are both low, which again may indicate a fault condition. Also if both trip signals are simultaneously high, this again may indicate an unwanted condition. Any of these conditions where both the active high and the active low signals are the same causes the trip error module 806 to send a trip error signal.

In one embodiment, the trip error signal includes a communication that there is a problem with the trip signal. In another embodiment, the trip error signal causes the alert module 606 to open the contact 108. In another embodiment, the trip error signal causes the microprocessor 808, the watchdog apparatus 134, or other device to reset. One of skill in the art will recognize other ways to utilize the trip error signal.

In one embodiment, the watchdog apparatus 134 includes at least a portion of a microprocessor 808 in the ground monitor apparatus 102. For example, the watchdog signal module 602 with the first pulse module 702 and the second pulse module 708 may be portions considered part of the watchdog apparatus 134 in the microprocessor 808. By having the microprocessor 808 generate the first pulse signal and/or the second pulse signal, the watchdog apparatus 134 may provide a way to monitor health of the microprocessor 808. For example, if one or both of the first pulse signal and the second pulse signal stop functioning, change pulse width, etc., this may indicate that the microprocessor 808 is not functioning. By having the signal monitoring module 604 possibly with a first pulse average module 704 and a first pulse window module 706, the second pulse average module 710, the second pulse window module 712, and the alert module 606 external to the microprocessor 808, these external modules 604, 704, 706, 710, 712, 606 may continue to function in the event of a failure of the microprocessor 808 and can send an alert signal.

In one embodiment, the watchdog apparatus 134 includes a power supply failure module 810 that determines failure of one or more power supplies providing power to the watchdog apparatus 134. The alert module 606 sends the alert signal in response to the power supply failure module 810 determining that the analog power supply and/or the digital power supply has failed. Typically the ground monitor apparatus 102, the watchdog apparatus 134, and/or the power source 104 includes one or more power supplies that provide power to circuits, to the microprocessor 808, and to other equipment known in the art. The one or more power supplies may be analog, digital, or other type of power supply that provides power. Typically when a power supply fails, equipment receiving power from the power supply stops functioning or malfunctions. The power supply failure module 810 monitors the power supplies for failure and sends the alert signal which opens the contact 108 when the power supply failure module 810 determines that a failure condition exists in a power supply.

Figure 9:
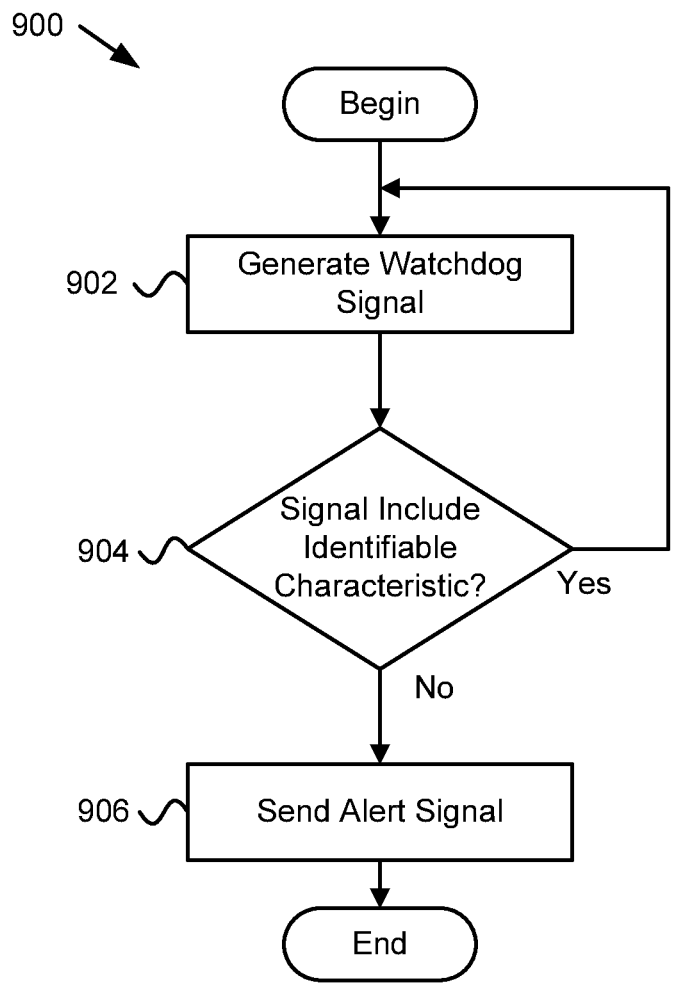
FIG. 9 is a schematic block diagram illustrating one embodiment of a method for a watchdog function in accordance with an embodiment of the present invention.

FIG. 9 is a schematic block diagram illustrating one embodiment of a method 900 for a watchdog function in accordance with an embodiment of the present invention. The method 900 begins and generates 902 a watchdog signal. The watchdog signal is generated at a specific interval and includes an identifiable characteristic. The watchdog signal is a part of a device being monitored for functionality, such as a microprocessor 808 or other device. The method 900 determines 904 if the watchdog signal includes the identifiable characteristic. If the method 900 determines 904 that the watchdog signal includes the identifiable characteristic, the method 900 returns and generates 902 the watchdog signal. If the method 900 determines 904 that the watchdog signal does not include the identifiable characteristic, the method 900 sends 906 an alert signal, and the method 900 ends.

Figure 10:
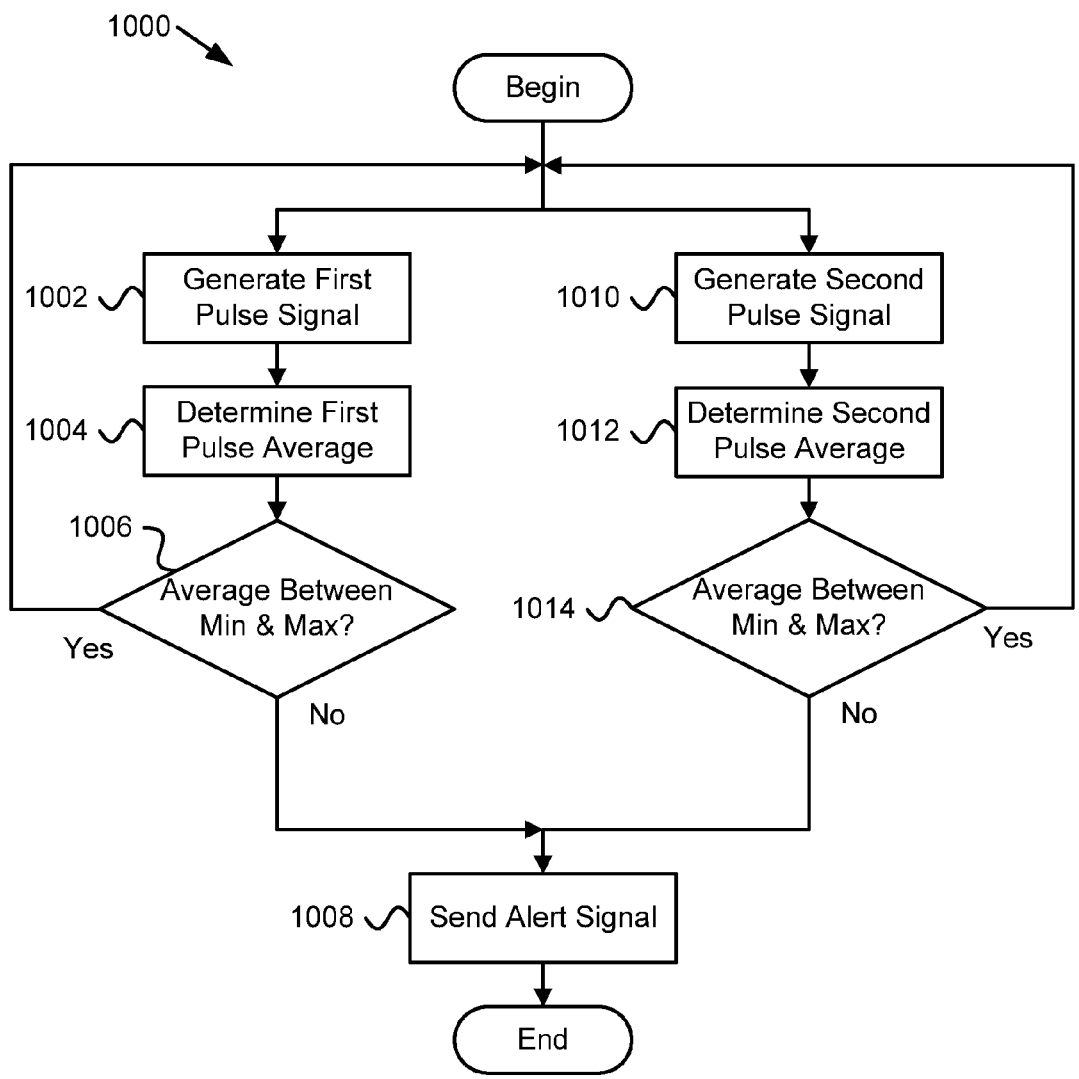
FIG. 10 is a schematic block diagram illustrating another embodiment of a method for a watchdog function in accordance with an embodiment of the present invention.

FIG. 10 is a schematic block diagram illustrating another embodiment of a method 1000 for a watchdog function in accordance with an embodiment of the present invention. The method 1000 begins and generates 1002 a first pulse signal of a first frequency. The first pulse signal includes a pulse of a first pulse width. The method 1000 determines 1004 a first pulse average. The first pulse average includes an average level of one or more periods of the first pulse signal. The method 1000 determines 1006 if the first pulse average is between a first pulse maximum threshold and a first pulse minimum threshold. If the method 1000 determines 1006 that the first pulse average is between a first pulse maximum threshold and a first pulse minimum threshold, the method 1000 returns and generates 1002 the first pulse signal. If method 1000 determines 1006 that the first pulse average is not between a first pulse maximum threshold and a first pulse minimum threshold, the method 1000 sends 1008 an alert signal, and the method 1000 ends.

In addition, the method 1000 generates 1010 a second pulse signal of a second frequency. The second pulse signal includes a pulse of a second pulse width. The first pulse signal and the second pulse signal may be different or the same. The method 1000 determines 1012 a second pulse average where the second pulse average includes an average level of one or more periods of the second pulse signal. The method 1000 determines 1014 if the second pulse average is between a second pulse maximum threshold and a second pulse minimum threshold. If the method 1000 determines 1014 that the second pulse average is between a second pulse maximum threshold and a second pulse minimum threshold, the method 1000 returns and generates 1010 the second pulse signal. If method 1000 determines 1014 that the second pulse average is not between a second pulse maximum threshold and a second pulse minimum threshold, the method 1000 sends 1008 an alert signal, and the method 1000 ends.

Figure 11:
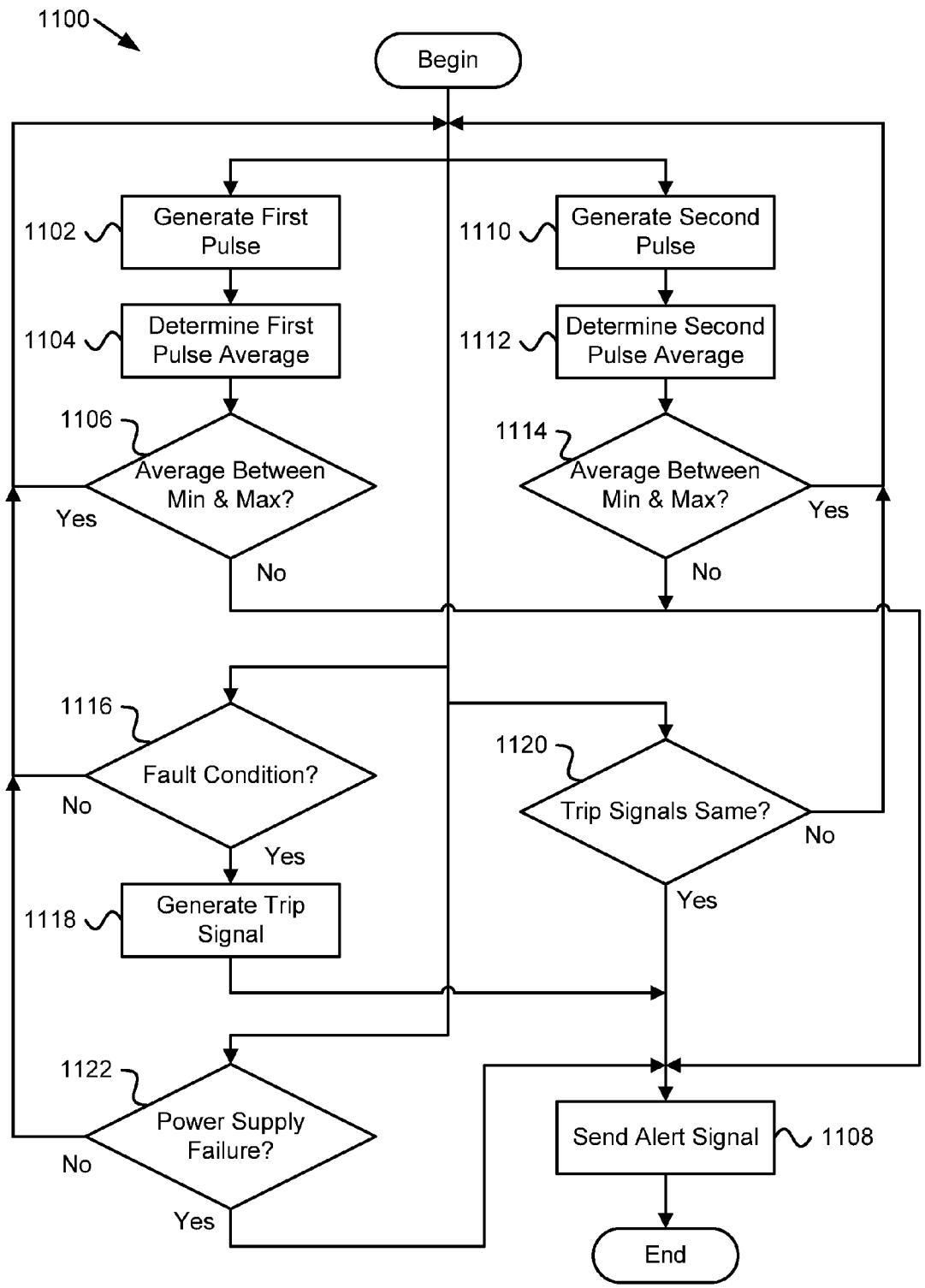
FIG. 11 is a schematic block diagram illustrating a third embodiment of a method for a watchdog function in accordance with an embodiment of the present invention.

FIG. 11 is a schematic block diagram illustrating a third embodiment of a method 1100 for a watchdog function in accordance with an embodiment of the present invention. The method 1100 begins and generates 1102 a first pulse signal of a first frequency. The first pulse signal includes a pulse of a first pulse width. The method 1100 determines 1104 a first pulse average. The first pulse average includes an average level of one or more periods of the first pulse signal. The method 1100 determines 1106 if the first pulse average is between a first pulse maximum threshold and a first pulse minimum threshold. If the method 1100 determines 1106 that the first pulse average is between a first pulse maximum threshold and a first pulse minimum threshold, the method 1100 returns to the beginning. If method 1100 determines 1106 that the first pulse average is not between a first pulse maximum threshold and a first pulse minimum threshold, the method 1100 sends 1108 an alert signal, and the method 1100 ends.

In addition, the method 1100 generates 1110 a second pulse signal of a second frequency. The second pulse signal includes a pulse of a second pulse width. The first pulse signal and the second pulse signal may be different or the same. The method 1100 determines 1112 a second pulse average where the second pulse average includes an average level of one or more periods of the second pulse signal. The method 1100 determines 1114 if the second pulse average is between a second pulse maximum threshold and a second pulse minimum threshold. If the method 1100 determines 1114 that the second pulse average is between a second pulse maximum threshold and a second pulse minimum threshold, the method 1100 returns to the beginning. If method 1100 determines 1114 that the second pulse average is not between a second pulse maximum threshold and a second pulse minimum threshold, the method 1100 sends 1108 an alert signal, and the method 1100 ends.

The method 1100 also determines 1116 if a fault condition exists in the power source 104, the ground monitor apparatus 102, etc. If the method 1100 determines 1116 that a fault condition does not exist, the method 1100 returns to the beginning. If the method 1100 determines 1116 that a fault condition exists, the method 1100 generates 1118 a trip signal and the method 1100 sends 1108 an alert signal. The method 1100 also determines 1120 if the trip signals, one being active high and another being active low, are the same. If the method 1100 determines 1120 that the trip signals are not the same, the method 1100 returns to the beginning. If the method 1100 determines 1120 that the trip signals are the same, the method 1100 sends 1108 an alert signal. The method 1100 determines 1122 if a power supply has failed. If the method 1100 determines 1122 that a power supply has not failed, the method 1100 returns to the beginning and generates 1102, 1104 the first and second pulse signals, determines 1116 if a fault condition exists, determines 1120 if the trip signals are the same, and determines 1122 if a power supply has failed. If the method 1100 determines 1122 that a power supply has failed, the method 1100 sends 1108 an alert signal, and the method 1100 ends.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A watchdog apparatus comprising:
    a watchdog signal module that generates a watchdog signal, the watchdog signal generated at a specific interval and comprising an identifiable characteristic, the watchdog signal module being part of a device being monitored for functionality, wherein the watchdog signal module comprises:
        a first pulse module that generates a first pulse signal of a first frequency, the first pulse signal comprising a pulse of a first pulse width; and
        a second pulse module that generates a second pulse signal of a second frequency, the second pulse signal comprising a pulse of a second pulse width, wherein the first pulse width differs from the second pulse width, the watchdog signal comprising the first pulse signal and the second pulse signal;
    a signal monitoring module that determines if the watchdog signal includes the identifiable characteristic, wherein the signal monitoring module comprises
        a first pulse average module that determines a first pulse average, the first pulse average comprising an average level of one or more periods of the first pulse signal;
        a second pulse average module that determines a second pulse average, the second pulse average comprising an average level of one or more periods of the second pulse signal;
        a first pulse window module that determines if the first pulse average is between a first pulse maximum threshold and a first pulse minimum threshold; and
        a second pulse window module that determines if the second pulse average is between a second pulse maximum threshold and a second pulse minimum threshold; and
    an alert module that sends an alert signal in response to the signal monitoring module determining that the watchdog signal does not include the identifiable characteristic, wherein the alert module sends an alert signal in response to one or more of:
        the first pulse window module determining that the first pulse average is not between the first pulse maximum threshold and the first pulse minimum threshold; and
        the second pulse window module determining that the second pulse average is not between the second pulse maximum threshold and the second pulse minimum threshold.

2. The watchdog apparatus of claim 1, wherein the first frequency and the second frequency are substantially the same frequency.

3. The watchdog apparatus of claim 1, wherein the second pulse signal is inverted from the first pulse signal.

4. The watchdog apparatus of claim 1, wherein the first pulse module generates the first pulse signal independent from the second pulse module generating the second pulse signal.

5. The watchdog apparatus of claim 1, wherein the alert signal opens a contact, wherein opening the contact disconnects power to a load.

6. The watchdog apparatus of claim 5, further comprising a trip module that generates a trip signal, wherein the trip module generates the trip signal in response to a fault condition in a power source providing the power to the load, wherein the trip signal comprises an active high signal and an active low signal, the active high signal transitions from low to high when the trip module generates the trip signal and the active low signal transitions from high to low when the trip module generates the trip signal, wherein the alert module sends the alert signal in response to one or more of the active high signal transitioning high and the active low signal transitioning low.

7. The watchdog apparatus of claim 6, further comprising a trip error module that sends a trip error signal in response to determining that the active high signal and the active low signal are both simultaneously high or both simultaneously low for a predetermined amount of time.

8. The watchdog apparatus of claim 1, further comprising a power supply failure module that determines failure of one or more power supplies providing power to the watchdog apparatus, wherein the alert module sends the alert signal in response to the power supply failure module determining that at least one power supply has failed.

9. The watchdog apparatus of claim 1, wherein the watchdog apparatus monitors functionality of an apparatus to monitor ground current in a grounding conductor of a set of power cables connecting a power source to a load.

10. The watchdog apparatus of claim 9, wherein the apparatus to monitor ground current with the watchdog apparatus complies with Mine Safety and Health Administration ("MSHA") testing standard 30 the Code of Federal Regulations ("C.F.R.") section 75, 30 C.F.R. section 77, American Society for Testing and Materials ("ASTP") standard 2135, and MSHA document number ACRI 2003.

11. The watchdog apparatus of claim 9, wherein the apparatus to monitor ground current comprises a microprocessor that comprises at least the watchdog signal module wherein the watchdog signal module generates the watchdog signal on a pin of the microprocessor.

12. The watchdog apparatus of claim 1, wherein the device being monitored comprises a microprocessor and the microprocessor comprises at least the watchdog signal module and the watchdog signal module generates the watchdog signal on a pin of the microprocessor and wherein the signal monitoring module and the alert module are external to the microprocessor.

13. The watchdog apparatus of claim 1, wherein the identifiable characteristic comprises at least one frequency and wherein the signal monitoring module determines if the watchdog signal comprises the at least one frequency.

14. The watchdog apparatus of claim 1, wherein the identifiable characteristic comprises a digital pattern and wherein the signal monitoring module determines if the watchdog signal comprises the digital pattern.

15. A system comprising:
one or more contacts that disconnect a load in an open position;
a ground monitor apparatus comprising
a watchdog signal module that generates a watchdog signal, the watchdog signal generated at a specific interval and comprising an identifiable characteristic, the watchdog signal module being part of a device being monitored for functionality, wherein the watchdog signal module comprises
a first pulse module that generates a first pulse signal of a first frequency, the first pulse signal comprising a pulse of a first pulse width, the watchdog signal comprising the first pulse signal; and
a second pulse module that generates a second pulse signal of a second frequency, the second pulse signal comprising a pulse of a second pulse width, wherein the first pulse width differs from the second pulse width, the watchdog signal comprising the first pulse signal and the second pulse signal;
a signal monitoring module that determines if the watchdog signal includes the identifiable characteristic, wherein the signal monitoring module comprises
a first pulse average module that determines a first pulse average, the first pulse average comprising an average level of one or more periods of the first pulse signal;
a second pulse average module that determines a second pulse average, the second pulse average comprising an average level of one or more periods of the second pulse signal;
a first pulse window module that determines if the first pulse average is between a first pulse maximum threshold and a first pulse minimum threshold; and
a second pulse window module that determines if the second pulse average is between a second pulse maximum threshold and a second pulse minimum threshold; and
an alert module that sends and alert signal in response to the signal monitoring module determining that the watchdog signal does not include the identifiable characteristic, wherein the alert module sends an alert signal in response to one or more of
the first pulse window module determining that the first pulse average is not between the first pulse maximum threshold and the first pulse minimum threshold; and
the second pulse window module determining that the second pulse average is not between the second pulse maximum threshold and the second pulse minimum threshold,
wherein the alert signal opens the one or more contacts.

16. A method comprising:
generating a watchdog signal comprising generating a first pulse signal of a first frequency, the first pulse signal comprising a pulse of a first pulse width, and generating a second pulse signal of a second frequency, the second pulse signal comprising a pulse of a second pulse width, wherein the first pulse width differs from the second pulse width, the watchdog signal comprising the first pulse signal and the second pulse signal, the watchdog signal generated at a specific interval and comprising an identifiable characteristic, generating the watchdog signal comprising part of monitoring a device for functionality;
determining if the watchdog signal includes the identifiable characteristic comprising
determining a first pulse average, the first pulse average comprising an average level of one or more periods of the first pulse signal;
determining a second pulse average, the second pulse average comprising an average level of one or more periods of the second pulse signal;
determining if the first pulse average is between a first pulse maximum threshold and a first pulse minimum threshold; and
a second pulse window module that determines if the second pulse average is between a second pulse maximum threshold and a second pulse minimum threshold; and
sending an alert signal in response to the signal monitoring module determining that the watchdog signal does not include the identifiable characteristic, wherein determining that the watchdog signal does not include the identifiable characteristic comprises one or more of
determining that the first pulse average is not between the first pulse maximum threshold and the first pulse minimum threshold; and
determining that the second pulse average is not between the second pulse maximum threshold and the second pulse minimum threshold.

* * * * *